(12) United States Patent
Murnan et al.

(10) Patent No.: US 7,551,359 B2
(45) Date of Patent: Jun. 23, 2009

(54) BEAM SPLITTER APPARATUS AND SYSTEM

(75) Inventors: Andrew J. Murnan, Saratoga Springs, NY (US); Dean Faklis, Phoenix, AZ (US)

(73) Assignee: 3M Innovative Properties Company, St. Paul, MN (US)

( * ) Notice: Subject to any disclaimer, the term of this patent is extended or adjusted under 35 U.S.C. 154(b) by 245 days.

(21) Appl. No.: 11/531,870

(22) Filed: Sep. 14, 2006

(65) Prior Publication Data

US 2008/0068721 A1  Mar. 20, 2008

(51) Int. Cl.
G02B 27/14 (2006.01)
G02B 5/04 (2006.01)

(52) U.S. Cl. ...................... 359/629; 359/831

(58) Field of Classification Search ................ 359/629, 359/634, 636–640, 831, 833–834, 669
See application file for complete search history.

(56) References Cited

U.S. PATENT DOCUMENTS

| | | | |
|---|---|---|---|
| 4,796,038 A | 1/1989 | Allen et al. | |
| 4,797,696 A | 1/1989 | Allen et al. | |
| 4,884,697 A | 12/1989 | Takacs et al. | |
| 4,925,271 A | 5/1990 | Taniura | |
| 4,956,650 A | 9/1990 | Allen et al. | |
| 5,386,221 A | 1/1995 | Allen et al. | |
| 5,548,444 A * | 8/1996 | McLaughlin et al. | 359/629 |
| 5,671,047 A | 9/1997 | Curbelo | |
| 5,796,112 A | 8/1998 | Ichie | |
| 5,798,784 A | 8/1998 | Nonaka et al. | |
| 5,952,668 A | 9/1999 | Baer | |
| 6,084,706 A | 7/2000 | Tamkin et al. | |
| 6,177,170 B1 | 1/2001 | Nash et al. | |
| 6,178,028 B1 | 1/2001 | Washiyama et al. | |
| 6,243,209 B1 | 6/2001 | Howells | |
| 6,271,514 B1 | 8/2001 | Thomas et al. | |
| 6,310,710 B1 | 10/2001 | Shahar et al. | |
| 6,316,153 B1 | 11/2001 | Goodman et al. | |
| 6,369,951 B1 | 4/2002 | Spanner | |
| 6,466,352 B1 | 10/2002 | Shahar et al. | |
| 6,590,852 B1 | 7/2003 | McCormick, Jr. | |
| 6,611,379 B2 | 8/2003 | Qian et al. | |
| 6,713,772 B2 | 3/2004 | Goodman et al. | |
| 6,730,256 B1 | 5/2004 | Bloomstein | |
| 6,731,320 B1 | 5/2004 | Allen et al. | |
| 6,750,266 B2 | 6/2004 | Bentsen et al. | |
| 6,788,445 B2 | 9/2004 | Goldberg et al. | |
| 6,841,340 B2 | 1/2005 | Tani | |

(Continued)

OTHER PUBLICATIONS

U.S. Appl. No. 11/531,836, entitled "Optical System Suitable for Processing Multiphoton Curable Photoreactive Compositions", filed Sep. 14, 2006.

(Continued)

Primary Examiner—Scott J Sugarman
Assistant Examiner—Dawayne A Pinkney
(74) Attorney, Agent, or Firm—Robert S. Moshrefzadeh

(57) ABSTRACT

A beam splitter apparatus comprises a beam splitter and a plurality of prisms disposed about the beam splitter. The beam splitter apparatus is configured to split an incident laser beam into a plurality of beamlets exhibiting substantially equal energy and traversing substantially equal optical path lengths through the beam splitter apparatus.

21 Claims, 11 Drawing Sheets

U.S. PATENT DOCUMENTS

| | | | |
|---|---|---|---|
| 6,852,766 | B1 | 2/2005 | DeVoe |
| 6,855,478 | B2 | 2/2005 | DeVoe et al. |
| 6,863,234 | B2 | 3/2005 | Mishina |
| 6,995,336 | B2 | 2/2006 | Hunt et al. |
| 2001/0045523 | A1 | 11/2001 | Baer |
| 2002/0162360 | A1 | 11/2002 | Schaffer et al. |
| 2003/0151833 | A1* | 8/2003 | Berman et al. ............... 359/831 |
| 2003/0155667 | A1 | 8/2003 | Devoe et al. |
| 2003/0164565 | A1 | 9/2003 | O'Brien |
| 2004/0012872 | A1 | 1/2004 | Feming et al. |
| 2004/0156134 | A1 | 8/2004 | Furuki et al. |
| 2005/0057736 | A1 | 3/2005 | Tani |
| 2005/0111089 | A1 | 5/2005 | Baer |
| 2005/0202352 | A1 | 9/2005 | Cyganski et al. |
| 2005/0208431 | A1 | 9/2005 | Devoe et al. |
| 2005/0263690 | A1 | 12/2005 | Araya et al. |
| 2006/0028634 | A1 | 2/2006 | Tuberfield et al. |

OTHER PUBLICATIONS

U.S. Appl. No. 60/752,529, entitled, "Method And Apparatus For Processing Multiphoton Curable Photreactive Compositions", filed Dec. 21, 2005.

U.S. Appl. No. 11/313,482, entitled, "Process for Making Microlens Arrays and Masterforms", filed Dec. 21, 2005.

Hoffnagle et al., "Bean Shaping with a Plano-Aspheric Lens Pair," *Opt. Eng.*, vol. 42, No. 11, pp. 3090-3099, Nov. 2003.

Kato et al., "Multiple-Spot Parallel Processing for Laser Micronanofabrication," *Applied Physics Letters*, vol. 86, 044102, 3 pgs., 2005.

Maruo et al., "Three-Dimensional Microfabrication With Two-Photon-Absorbed Photopolymerization," *Opt. Letter*, vol. 22, No. 2, pp. 132-134, 1997.

Serbin et al., "Fabrication of Woodpile Structures by Two-Photon Polymerication and Investigation of Their Optical Properties," *Optics Express*, vol. 12, No. 21, pp. 5221-5228, Oct. 18, 2004.

Sun et al., "Two-Photon Photopolymerization and 3D Lithogrpahic Microfabrication" *Advances in Polymer Science*, vol. 170, p. 169-273, 2004.

* cited by examiner

BEAM SPLITTER APPARATUS AND SYSTEM

TECHNICAL FIELD

The invention relates to an optical apparatus, and more particularly, an apparatus for splitting a light beam into a plurality of beamlets exhibiting substantially equal energy.

BACKGROUND

In some multiphoton curing processes, such as the one described in U.S. Pat. No. 6,855,478, which is incorporated herein by reference in its entirety, a layer of material including a multiphoton curable photoreactive composition is applied on a substrate (e.g., a silicon wafer) and selectively cured using a focused source of radiant energy, such as a laser beam. A multiphoton curing technique may be useful for fabricating two-dimensional and/or three-dimensional (3D) microstructures and nanostructures.

In one fabrication technique, a voxel is created when a pulsed laser beam of near-infrared (NIR) radiation is focused into an engineered photopolymer resin. A non-linear interaction process within the resin converts a portion of the NIR radiation to a shorter wavelength, which cures the resin near a focus of the laser beam, where two photons of the NIR radiation are absorbed substantially simultaneously. The curing of the resin may be referred to as "photopolymerization," and the process may be referred to as a "two-photon photopolymerization" process. Photopolymerization of the resin does not occur in regions of the resin exposed to portions of the NIR radiation having an insufficient intensity because the resin does not absorb the NIR radiation in those regions.

A 3D structure may be constructed voxel-by-voxel with a multiphoton photopolymerization process by controlling a location of the focus of the laser beam in three dimensions (i.e., x-axis, y-axis, and z-axis directions) relative to the resin.

SUMMARY

In general, the invention is directed toward a beam splitter apparatus for splitting an incident light beam into a plurality of beamlets having substantially the same beam characteristics (e.g., substantially equal energy). In one embodiment, a beam splitter apparatus in accordance with the present invention includes a plurality of prisms disposed about one or more beam splitters. That is, an incident beam is split into a plurality of beamlets, where an optical path difference between the beamlets is substantially zero. Because the beamlets traverse substantially similar optical path lengths through the beam splitter apparatus, the beamlets undergo substantially similar pulse stretching, if any. As a result, pre-dispersion or post-dispersion compensation (if desired) is simplified.

In one embodiment of the invention, one or more incident laser beams are directed at the beam splitter apparatus, and as the beam(s) traverses the beam splitter and propagates through at least one prism passage (i.e., propagate through one prism and reflect back into the beam splitter or into another beam splitter), the beam is repeatedly split into a plurality of beamlets. Each of the beamlets traverses substantially equal optical path lengths through the beam splitter apparatus, and accordingly, each of the beamlets has substantially equal pulse widths.

The resulting beamlets may be arranged into a linear array or a two-dimensional (2D) array of beamlets, which may be useful for incorporating into a multiple photon photopolymerization process. The array of beamlets may be focused onto an image plane by a positive focusing lens, which defines a field of view of the image plane. Within the field of view are subfields, where each of the subfields defines an area of the image plane within which one or more beamlets are scanned in x-axis and y-axis directions. An array of beamlets having substantially identical characteristics may be incorporated into a multiphoton photopolymerization fabrication process to fabricate substantially equal sized voxels within multiple regions of resin substantially simultaneously, which enables the fabrication process to fabricate a plurality of two-dimensional (2D) and/or three-dimensional (3D) structures in parallel.

In one embodiment, the invention is directed to a system comprising a light source to provide an incident light beam, and a beam splitter apparatus to split the incident light beam into at least ($2^n-1$) beamlets. The beam splitter apparatus comprises a beam splitter; and ($2n-2$) prisms in optical contact with the beam splitter.

In another embodiment, the invention is directed to an apparatus comprising a beam splitter configured to split an incident light beam into a first beamlet and a second beamlet, a first prism member configured to reflect the first beamlet into the beam splitter, where the first beamlet traverses the beam splitter and splits into a third beamlet and a fourth beamlet, and a second prism member configured to reflect the second beamlet into the beam splitter, where the second beamlet traverses the beam splitter and splits into a fifth and sixth beamlet. The apparatus further comprises a third prism member configured to reflect the third and fifth beamlets into the beam splitter, and a fourth prism member configured to reflect the fourth and sixth beamlets into the beam splitter. The first, second, third, and fourth prisms are arranged to achieve a predetermined path difference between the third, fourth, fifth, and sixth beamlets.

In yet another embodiment, the invention is directed to an optical apparatus for splitting an incident light beam into a plurality of beamlets. The optical apparatus comprises a first cube beam splitter comprising a first splitter portion, a second cube beam splitter comprising a second splitter portion, and a third cube beam splitter comprising a third splitter portion. The first, second, and third splitter portions are substantially aligned end-to-end to form a substantially straight line. The optical apparatus further comprises a first pentaprism disposed between the first and second cube beam splitters, a second pentaprism disposed between the first and second beam splitters and opposing the first pentaprism, a third pentaprism disposed between the second and third beam splitters, and a fourth pentaprism disposed between the second and third beam splitters and opposing the third pentaprism.

In yet another embodiment, the invention is directed to a system comprising a light source to provide an incident light beam, and a beam splitter apparatus to split the incident light beam into a plurality of beamlets separated from each other by a pitch P. The beam splitter apparatus comprises a beam splitter, which splits the incident light beam S number of times, and a first and second set of prisms. The first set of prisms is disposed along a first axis, wherein each of the prisms of the first set of prisms contacts the beam splitter along dimension $L_z$ and an $n^{th}$ prism of the first set of prisms is a distance $Z_n$ from a first reference point, where $Z_n$ is calculated according to a first formula $$Z_n = \sum_{n=1}^{S-1} \frac{n \cdot L_z}{2}.$$

The second set of prisms is disposed along a second axis that is orthogonal to the first axis, wherein each of the prisms of the second set of prisms contacts the beam splitter along dimension $L_x$ and an $n^{th}$ prism of the second set of prisms is a distance $X_n$ from a second reference point, where $X_n$ is calculated according to a second formula $$X_n = \sum_{n=1}^{s-1} \frac{n \cdot L_x}{2} + P \cdot 2^{(n-2)}.$$

The details of one or more embodiments of the invention are set forth in the accompanying drawings and the description below. Other features, objects, and advantages of the invention will be apparent from the description and drawings, and from the claims.

DETAILED DESCRIPTION

A beam splitter apparatus in accordance with the invention splits a laser beam into a plurality of beamlets having substantially equal energy and substantially equal wavelengths. A "beamlet" generally refers to a laser beam that is created by splitting another laser beam. In one embodiment, the beam splitter apparatus includes a beam splitter and a plurality of prisms disposed about the beam splitter such that beamlets in a group beamlets traverse substantially equal path lengths in a given prism passage. A prism passage refers to an iteration in which a group of beamlets traverses from a beam splitter through at least one prism substantially simultaneously prior to traversing the beam splitter (or another beam splitter) again. In one embodiment, each beamlet in the group of beamlets traverses the same region of the beam splitter in a given prism passage. In another embodiment, a group of beamlets traverses a different beam splitter after each prism passage. Due to the arrangement of prisms of the beam splitter apparatus relative to each other, each of the beamlets formed from an incident laser beam traverses a beam splitter the same number of times, as well as traverses through the same number of prisms. In one embodiment, the number of beamlets in a group of beamlets doubles subsequent to traversing the beam splitter.

Figure 1A:
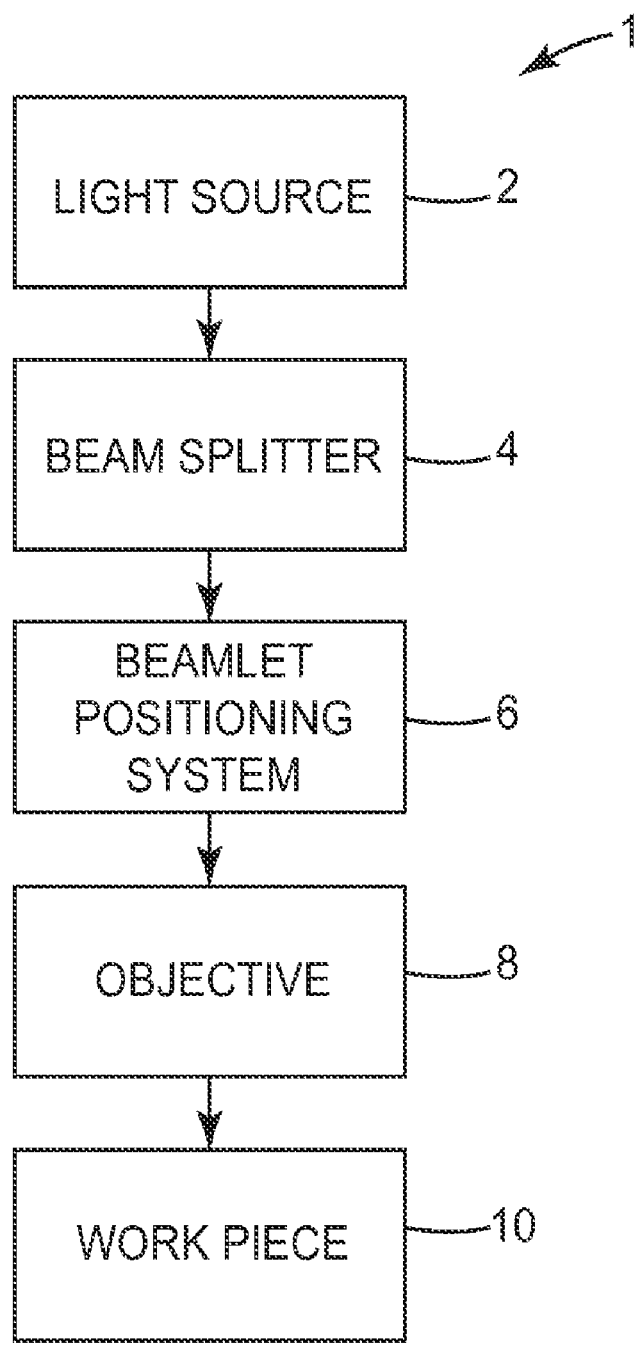
FIG. 1A is a block diagram of an optical system incorporating a beam splitter apparatus in accordance with the present invention.
Figure 1B:
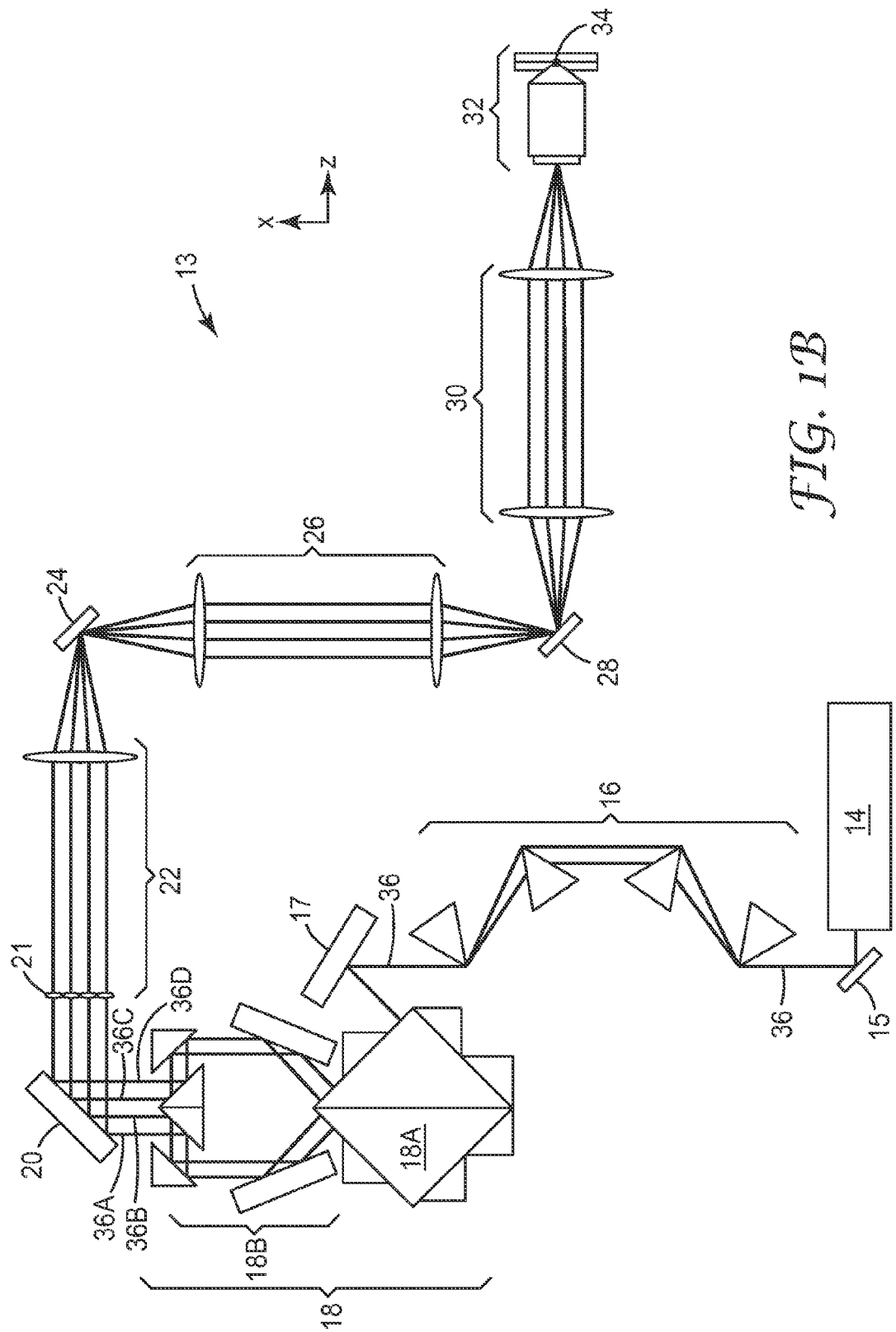
FIG. 1B is a schematic diagram of an optical system, which is an embodiment of the optical system shown in FIG. 1A.

A plurality of beamlets having substantially equal energy and optical path lengths may be useful for many applications, such as, but not limited to, parallel processing voxels in a multiple photon photopolymerization fabrication process, an example of which is described in reference to FIG. 1B, or other applications involving selectively exposing photosensitive material, as well as metrology and interferometer applications. An optical system into which a beam splitter apparatus in accordance with the invention may be incorporated is described in further detail in U.S. patent application Ser. No. 11/531,836, which was filed on the same date as the present disclosure and is incorporated herein in its entirety.

When an array of beamlets exhibiting different energies and optical path lengths is incorporated into a multiphoton photopolymerization process, the beamlets may form (in parallel) a plurality of voxels of varying sizes. Significant variation in voxel size may place limits on the quality of resultant structures produced by the multiphoton photopolymerization process, which may limit the possibility of using a multiphoton photopolymerization process for mass production of two-dimensional (2D) and/or three-dimensional (3D) microstructures and/or nanostructures. A beam splitter apparatus in accordance with the invention, however, is useful for producing a plurality of substantially equal sized voxels in parallel because the beam splitter apparatus produces a plurality of substantially identical beamlets that may each be used to cure a separate region of resin. Thus, the beam splitter apparatus may be useful for mass fabrication of 3D microstructures and/or nanostructures.

FIG. 1A is a block diagram of optical system 1, which includes light beam source 2, beam splitter 4 in accordance with the invention, beamlet positioning system 6, objective 8, and work piece 10. Light beam source 2 generates a light beam, such as a collimated or converging laser beam, which beam splitter 4 splits into a plurality of beamlets that exhibit substantially equal energy (i.e., intensity) and may also have substantially equal pulse widths. An even or odd number of beamlets may be formed, and beam splitter 4 may split the incident laser beam into any suitable number of beamlets, such as tens, hundreds or thousands of beamlets. A "beamlet" generally refers to a laser beam that is created by splitting another light beam. In one embodiment, the beamlets are formed by repeatedly splitting an incident light beam. Beamlet positioning system 6 scans the beamlets from beam splitter 4 in x-axis, y-axis, and/or z-axis directions, depending on the particular arrangement of optical system 1 and the desired direction of propagation of the beamlets. As described below in reference to FIG. 1B, beamlet positioning system 6 may also include optical components, such as a plurality of steering mirrors for precisely guiding an angle of tilt of the beamlets formed by beam splitter 4. Beamlet positioning system 6 may also focus/align the beamlets with objective 8, and in one embodiment, a pupil of objective 8.

Optical system 1 may be useful for implementing in optical fabricating processes, such as a multiphoton photopolymerization fabrication process, in which case, work piece 10 may be a layer of photosensitive resin (e.g., a multiphoton curable photoreactive composition). Examples of suitable multiphoton curable photoreactive compositions are described in U.S. Patent Application Ser. No. 60/752,529, entitled, "METHOD AND APPARATUS FOR PROCESSING MULTIPHOTON CURABLE PHOTREACTIVE COMPOSITIONS" and U.S. patent application Ser. No. 11/313,482, which are both incorporated herein by reference in their entirety.

When implemented into an optical fabrication process, objective 8 of optical system 1 is adapted to direct a plurality of beamlets having substantially equal energy and optical paths into layer of resin 10 in order to selectively cure regions of resin 10 in order to fabricate a plurality of substantially equal sized voxels within layer of resin 10. In this way, optical system 1 may increase a throughput of a multiphoton fabrication process by a factor generally equal to a number of beamlets in the array (e.g., hundreds or thousands) because the plurality of beamlets may be used to fabricate a plurality of structures in parallel, whether the structures include repeating or nonrepeating patterns. In one embodiment, the structures are substantially similar, and in another embodiment, the structures are dissimilar. In yet another embodiment, two or more of the beamlets from optical system 1 may be used to fabricate a single structure. Fabricating a single structure with one or more beamlets may be shorten a fabrication time for a relatively large structure as compared to a process that fabricates the structure with a single beamlet.

FIG. 1B is a schematic diagram of optical system 13, which is an embodiment of optical system 1 of FIG. 1A. Optical system 13 includes laser beam source 14, dispersion compensation portion 16, beam splitter system 18, mirror 20, microlens array 21, Z-axis telescope 22, first steering mirror 24, first relay 26, second steering mirror 28, second relay 30, and focusing lens 32. Beam splitter 4 of FIG. 1A may include beam splitter system 18, and objective 8 of FIG. 1A may be focusing lens 32. Beamlet positioning system 6 of FIG. 1A may include z-axis telescope 22, first steering mirror 24, first relay 26, second steering mirror 28, and second relay 30.

Optical system 13 produces a plurality focused laser beamlets 36A-36D that focus on and selectively cure layer of resin 34. Optical system 13 may be enclosed in an environmentally controlled environment to control the amount of dust and/or temperature in which optical system 13 operates. Beamlets 36A-36D traverse substantially equal optical path lengths through optical system 13. In general, an "optical path" through optical system 13 is a path of one or more laser beams (or beamlets) from laser beam source 14 to focusing lens 32. As with optical system 1, optical system 13 may be useful for implementing in optical fabricating processes, such as a multiphoton photopolymerization fabrication process, in which case, layer of resin 34 may be a layer of photosensitive resin (e.g., a multiphoton curable photoreactive composition) that is selectively cured in a plurality of regions substantially simultaneously by the plurality of focused laser beamlets 36A-36D.

In one embodiment, a suitable multiphoton curable photoreactive composition in layer of resin 34 includes at least one reactive species that is capable of undergoing an acid or radical initiated chemical reaction, as well as a multiphoton initiator system. Imagewise exposure of regions of layer of resin 34 with beamlets 36A-36D of an appropriate wavelength and sufficient intensity of light ("threshold intensity"), which may be, for example, a near infrared (NIR) intensity, from beamlets 36A-36D causes two-photon absorption in the multiphoton initiator system, which induces in the reactive species an acid or radical initiated chemical reaction in a region of the layer that is exposed to the light. This chemical reaction causes a detectable change in the chemical or physical properties in regions of layer of resin 34 that are exposed to beamlets 36A-36D. Examples of detectable changes include, for example, cross-linking, polymerization, and/or a change in solubility characteristics (for example, lesser or greater solubility in a particular solvent) as compared to the photoreactive composition prior to exposure. The occurrence of any of these detectable changes is referred to herein as curing, and the curing continues until a cured object is formed. The curing step may take place in any area within layer of resin 34. Following the curing step, layer of resin 34 may optionally be developed by removing a non-cured portion of the layer to obtain the cured object, or by removing the cured object itself from the layer.

In other applications of optical system 13, an image plane may be composed of another material or another type of image plane (e.g., a surface that is being measured). Furthermore, the term "plane" is not intended to limit an image plane to a substantially flat surface. Although optical system 13 is described herein with reference to a two-photon photopolymerization system, in other embodiments, optical system 13 may be implemented into other multiphoton photopolymerization systems and other optical systems for fabricating a 2D or 3D structure from photocurable material.

In the embodiment of FIG. 1B, laser beam source 14 outputs laser beam 36 in a series of pulses having relatively short pulse widths (e.g., less than about 200 femtosecond (fs), but other pulse widths may be applicable, depending on the application and the requirements for optical system 13). Laser beam source 14 may be, for example, a femtosecond-class laser beam generator, or may be a short coherence light source (e.g., a collimated arc lamp). In alternate embodiments, laser beam source 14 may be a converging laser beam generator. In yet other embodiments, other suitable radiant energy sources may be substituted for laser beam source 14. In addition, optical system 13 may include more than one laser beam source 14. For example, more than one laser beam source 14 (or other radiant energy source) may be required to achieve a certain power level per beamlet 36A-36D (e.g., 0.5 watt per beamlet 36A-36D). Additional laser beam sources may be disposed adjacent to laser beam source 14 or in any relationship with respect to laser beam source 14. For example, more than one laser beam source may be disposed "upstream" of dispersion compensation system 16 such that the multiple laser beams emanating from the multiple laser beam sources converge prior to propagating through dispersion compensation system 16. Alternatively, laser beam source 14 may output more than one laser beam 36.

Positioning mirror 15 positions laser beam 36 after laser beam 36 exits laser beam source 14. In alternate embodiments, more than one positioning mirror 15 may be used to position laser beam 36, depending on the desired direction of propagation of laser beam 36. In other alternate embodiments, positioning mirror 15 may be removed from optical system 13 and laser beam 36 may propagate to dispersion compensation system 16 without changing direction. The configuration of one or more positioning mirrors 15 may be modified depending on the design of optical system 13 and the desired direction of propagation of laser beam 36 following laser beam source 14.

Laser beam 36 passes through dispersion compensation system 16 in order to reshape laser beam 36 and compensate for any dispersion that results as laser beam 36 passes through optical system 13. For example, in some cases, a relatively short pulse width throughout the optical path defined by optical system 13 may be desired. However, because some incidental dispersion may result from optical elements (e.g., prisms, lenses, mirrors, and the like) of beam splitter system 18, microlens array 21, relays 26 and 30, and so forth, the pulse width of laser beam 36 may depart from the desired pulse width range. Dispersion compensation system 16 may be placed anywhere along optical system 13 prior to layer of resin 34. Furthermore, in some embodiments, optical system 13 may not include dispersion compensation system 16.

Figure 5A:
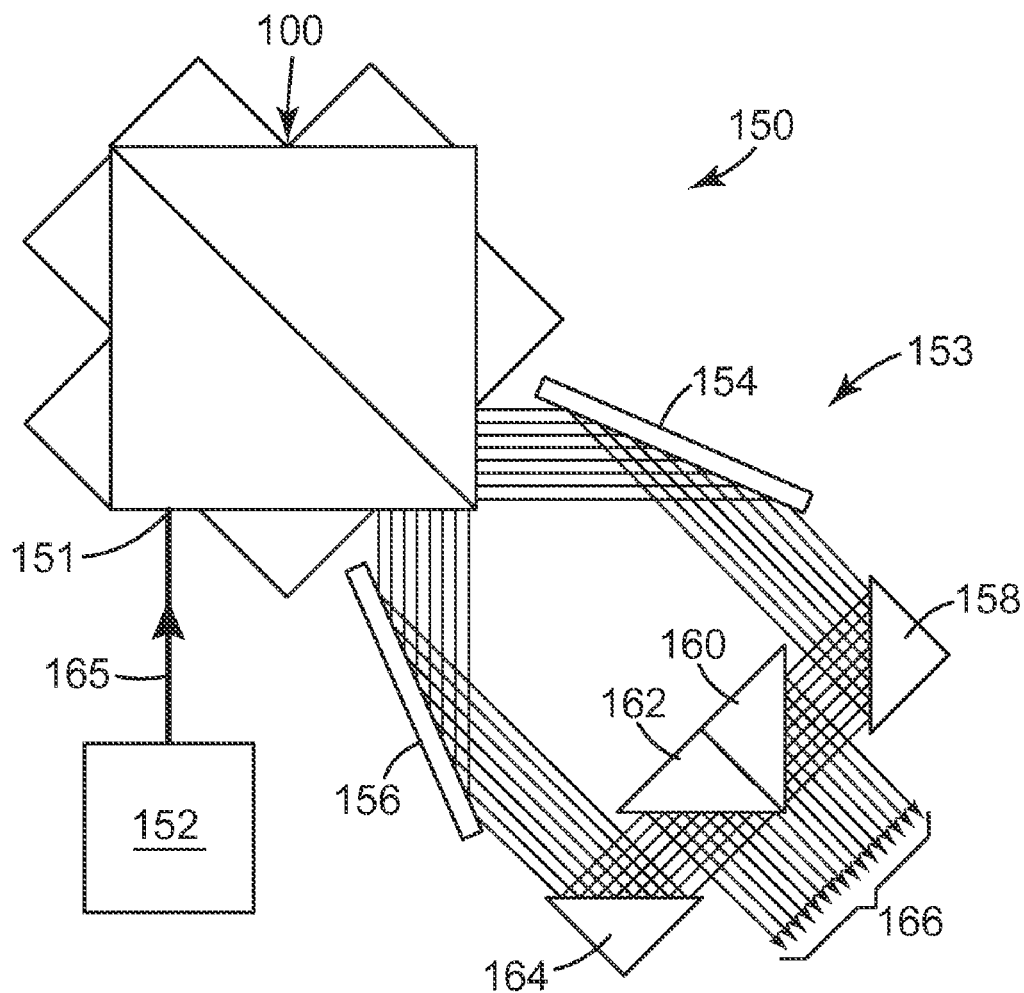
FIG. 5A is a schematic diagram of one embodiment of a beam splitter system, which incorporates the beam splitter apparatus of FIG. 4.
Figure 7A:
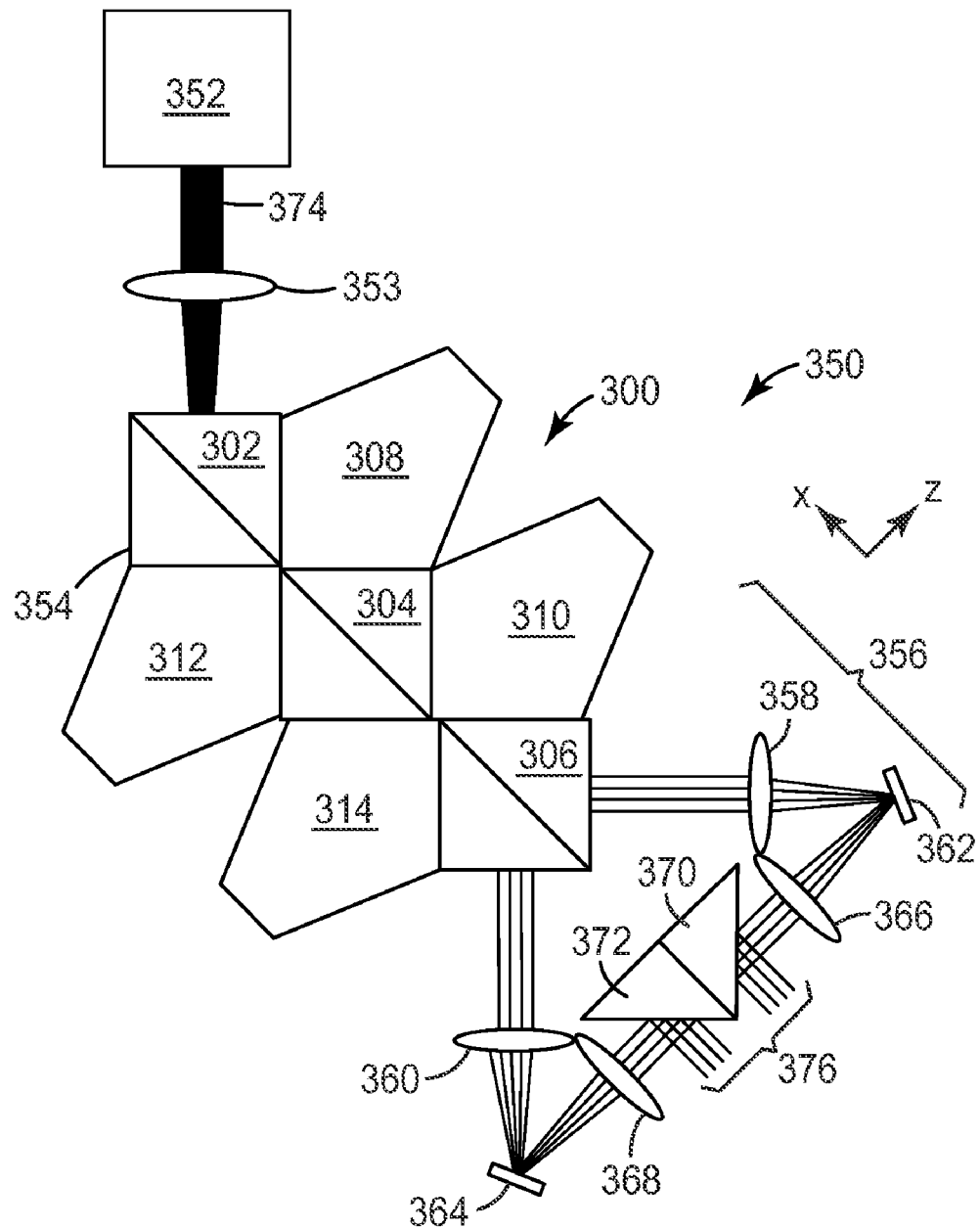
FIG. 7A is a schematic diagram of an embodiment of a beam splitter system that incorporates the beam splitter apparatus of FIG. 6.

After passing through dispersion compensation system 16, laser beam 36 passes through beam splitter system 18, which splits laser beam 36 into a plurality of beamlets 36A, 36B, 36C, and 36D of substantially equal energy that traverse substantially equal optical path lengths. Although four beamlets 36A-36D are shown in FIG. 1B, in other embodiments, beam splitter system 18 may split laser beam 36 into any even or odd number of beamlets, such as five, eight, sixteen, thirty-two, and so forth. Furthermore, beam splitter system 18 may split laser beam 36 into any suitable number of beamlets, such as tens, hundreds or thousands of beamlets. An example embodiment of a suitable laser beam splitter system 18 is shown in FIGS. 5A and 7A.

Figure 4:
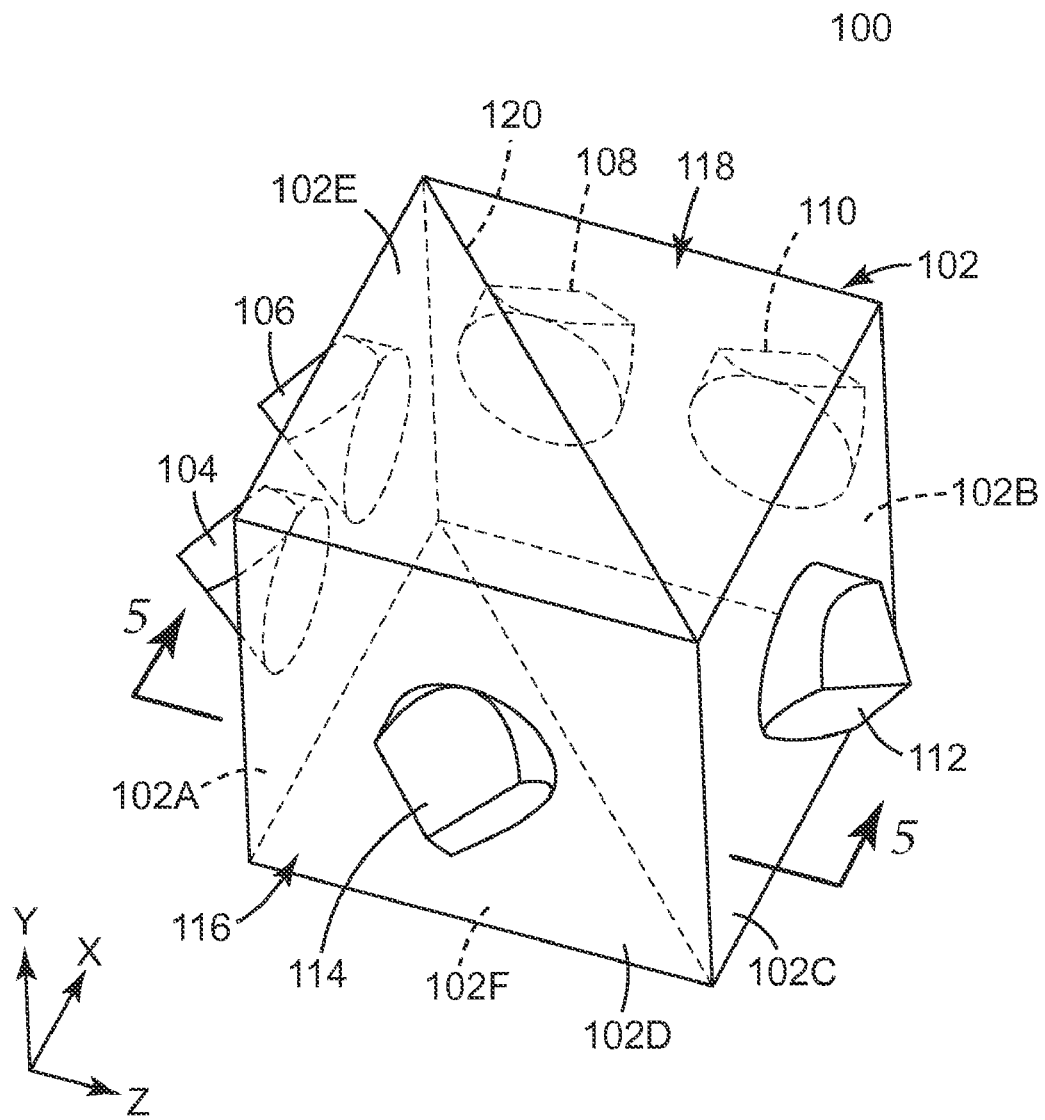
FIG. 4 is a perspective view of one embodiment of a beam splitter apparatus in accordance with the invention.

Beam splitter system 18 includes beam splitter apparatus 18A and focusing portion 18B. Beam splitter apparatus 18A splits incident laser beam 36 into beamlets 36A-36D, while focusing portion 18B arranges beamlets 36A-36D into a linear array of beamlets. In alternate embodiments, focusing portion 18B may arrange beamlets 36A-36D into any suitable arrangement, such as 2D array or a random arrangement. An odd number of beamlets may be achieved in one embodiment by absorbing, for example, an odd number of beamlets 36A-36D. For example, beamlet 36A may be absorbed by a black metal plate coated with thermally conductive material suitable for absorbing a light beamlet. Examples of beam splitter apparatus 18A and focusing portion 18B are shown in FIG. 4 (beam splitter apparatus 100 and focusing portion 153) and FIG. 6 (beam splitter apparatus 300 and focusing portion 356). In alternate embodiments, optical system 13 may include more than one beam splitter system. For example, a second beam splitter system may follow beam splitter system 18 in the embodiment shown in FIG. 1B in order to further split each beamlet 36A-36D into one or more beamlets.

After beamlets 36A-36D exit beam splitter system 18, beamlets 36A-36D reflect off of mirror 20 and pivot about 90° while maintaining the linear array arrangement. Depending on the configuration of optical system 13 and desired direction of beamlets 36A-36D, beamlets 36A-36D may also exit beam splitter system 18 and travel through z-axis telescope 22 without pivoting about 90°, or alternatively, beamlets 36A-36D may reflect off more than one mirror 20 or change direction by another angle. The linear array of beamlets 36A-36D moves through microlens array 21, which focuses and shapes beamlets 36A-36D.

Figure 2:
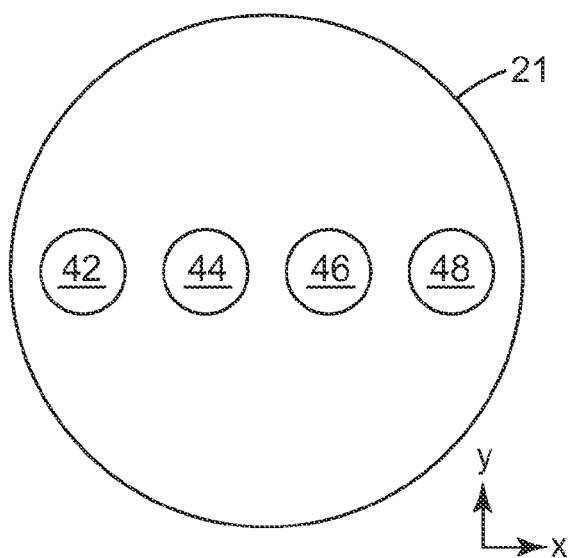
FIG. 2 is a schematic cross-sectional view of a microlens array, which may be incorporated into the optical system of FIG. 1B.

FIG. 2 is a schematic cross-sectional view of microlens array 21. Microlens array 21 includes four microlenses 42, 44, 46, and 48, which are arranged in a linear array. The surface of each microlens 42, 44, 46, and 48 may be aspherical in order to shape each of beamlets 36A-36D to achieve a desired irradiance. For example, microlens array 21 may create converging beamlets 36A-36D. Microlenses 42, 44, 46, and 48 may each be formed of fused silica or any other suitable optical material. Preferably, the optical material is a low dispersion, high thermal stability material. In the embodiment shown in FIG. 2, microlens array 21 is arranged such that each microlens 42, 44, 46, and 48 receives one beamlet 36A, 36B, 36C or 36D, and therefore, microlens 42, 44, 46, and 48 are arranged in the same linear array arrangement as beamlets 36A-36D. For example, beamlet 36A may move through microlens 42, beamlet 36B may move through microlens 44, beamlet 36C may move through microlens 46, and beamlet 36D may move through microlens 48.

In alternate embodiments, microlens 21 includes any suitable number of microlenses arranged in any suitable arrangement. Typically, the number of beamlets 36A-36D formed by beam splitter apparatus 18 and the number of microlenses in microlens array 21 are equal. Furthermore, the microlenses are typically disposed in the same arrangement as beamlets 36A-36D. For example, if a 2D array of sixteen beamlets in a plurality of rows and columns emanated from beam splitter system 18, microlens array 21 would typically include a 2D array of sixteen microlenses arranged in a similar arrangement of rows and columns in order to optically align each microlens with a beamlet. When a beamlet is "optically aligned" with a microlens, the beamlet is aligned to pass through the microlens. However, in other alternate embodiments, a microlens (e.g., microlens 42, 44, 46, or 46) may receive and focus more than one beamlet. In yet other alternate embodiments, microlens array 21 may be eliminated from optical system 13. For example, if laser beam source 14 outputs a converging beam, laser beamlets 36A-36D may be sufficiently focused as laser beam 36 and beamlets 36A-36D pass through beam splitter system 18, and microlens array 21 may not be necessary.

Returning now to FIG. 1B, beamlets 36A-36D pass through z-axis telescope 22 after traversing microlens array 21. A 3D structure may be constructed voxel-by-voxel within layer of resin 34 by controlling the location of the focus of beamlets in three dimensions (i.e., the x-axis, y-axis, and z-axis directions) relative to layer of resin 34. Orthogonal x-z axes are provided in FIG. 1B for purposes of illustration. Z-axis telescope 22 adjusts a z-axis position of beamlets 36A-36D with respect to layer of resin 34. Otherwise stated, z-axis telescope 22 "scans" beamlets 36A-36D in a z-axis direction. For example, a computerized device may control z-axis telescope 22 to adjust the z-axis position of beamlets 36A-36D within the layer of resin 34. As the z-axis position of beamlets 36A-36D is adjusted, the focal point of each beam 36A-36D likewise moves in the z-axis direction within resin 34. If desired, beamlets 36A-36D may be adjusted to have an appropriate wavelength and intensity such that at each of the focal points, beamlets 36A-36D cures the resin 34. As a result, z-axis telescope 22 may help to adjust a z-axis dimension of a 3D structure that is being fabricated within layer of resin 34. Z-axis telescope 22 enables a z-axis position of beamlets 36A-36D to be adjusted without having to move layer of resin 34. However, in some embodiments, layer of resin 34 may also be moved in the z-axis direction, which may be useful for fabricating 3D structures having a certain depth. For example, in one embodiment, a control system from Aerotech, Inc. of Pittsburgh, Pa. may be used to control a mechanical device that moves layer of resin 34 (or another workpiece) in the x-axis, y-axis, and z-axis directions. Moving layer of resin 34 may also be useful for fabricating a structure us that is larger than field-of-view 50 (FIG. 3A) of focusing lens 32.

After passing through z-axis telescope 22, beamlets 36A-36D reflect off first steering mirror 24 and through first relay 26. First steering mirror 24 is an electrically controllable mirror that adjusts the angle of propagation of beams 36A-

36D and scans beamlets 36A-36D within layer of resin 34. In the embodiment of FIG. 1B, first steering mirror 24 is configured to rotate in the x-axis in order to adjust the x-axis position of beamlets 36A-36D with respect to layer of resin 34, which enables a selection of an x-axis position of a region of layer of resin 34 that is selectively cured by each of beamlets 36A-36D. First steering mirror 24 scans beamlets 36A-36D in the x-axis direction, thereby changing the x-axis position of a focal point of each beamlet 36A-36D. In this way, first steering mirror 24 helps to adjust an x-axis dimension of a 3D structure that is being fabricated within layer of resin 34.

First relay 26 is an optical lens relay that, in effect, focuses beamlets 36A-36D on second steering mirror 28. In addition, as discussed below, first relay 26 help align beamlets 36A-36D with a pupil of focusing lens 32.

Second steering mirror 28 is an electrically controllable mirror that adjusts the angle of propagation of beams 36A-36D. Second steering mirror 28 is configured to rotate in the y-axis in order to adjust the y-axis position of beamlets 36A-36D in order to align beamlets 36A-36D with respect to layer of resin 34. Second steering mirror 28 scans beamlets 36A-36D in the y-axis direction, thereby changing the y-axis position of a focal point of each beamlet 36A-36D. In this way, first steering mirror 28 helps to adjust a y-axis dimension of a 3D structure that is being fabricated within layer of resin 34.

First steering mirror 24 and second steering mirror 28 allow for achieving small angles of tilt of beamlets 36A-36D. Both first steering mirror 24 and second steering mirror 28 may be computer controlled in order to accurately and precisely control the angles of tilt of beamlets 36A-36D, which enables a position of beamlets 36A-36D to be controlled by relatively small degrees. Thus, first and second steering mirrors 24 and 28 are useful for microfabrication and nanofabrication because the x and y axes positions of the voxels may be controlled within relatively small scales. In an alternate embodiment, a galvanometer may be substituted for steering mirror 24 and/or 28. However, steering mirrors 24 and 28 are typically more useful for achieving small angles of tilt. In one embodiment, WAVERUNNER control software, available from Nutfield Technology of Windham, N.H., may be used to control z-axis telescope 22, first steering mirror 24, and second steering mirror 28. In addition, a control system, such as NI LOOKOUT available from National Instruments Corporation of Austin, Tex., may be used to correct beamlet 36A-36D pointing errors that come before-axis telescope 22, first steering mirror 24, and second steering mirror 28 in order to reduce errors at the layer of resin 34 image plane.

Beamlets 36A-36D reflect off of second steering mirror 28 and into second relay 30. In one embodiment, first relay 26 and second relay 30 are substantially identical. First and second relays 26 and 30 are optical lens relays that, in effect, help align beamlets 36A-36D with a pupil of focusing positive lens 32 (which may also be referred to as an "objective" lens). It is typically desirable to align beamlets 36A-36D with a pupil of focusing lens 32 in order to avoid distortion. By aligning beamlets 36A-36D with the pupil of focusing lens 32, a numerical aperture (NA) of focusing lens 32 is substantially preserved. In one embodiment, focusing lens 32 has a NA of about 0.5 to about 1.5. The NA is generally measured with respect to a particular object or image point (e.g., resin 34). The NA of focusing lens 32 is related to the spot size of each beamlet 36A-36D, which affects the size of a voxel formed by each beamlet 36A-36D, as discussed below in reference to FIG. 3D. First relay 26 and/or second relay 30 may also magnify or shrink beamlets 36A-36D.

Focusing lens 32 may include an immersion objective, such as an oil immersion objective, and index matching fluid. The immersion objective may be included to remove spherical aberration from beamlets 36A-36D. Focusing lens 32 focuses each of beamlets 36A-36D tightly into layer of resin 34 in order to achieve a threshold intensity to cure regions of layer of resin 34 that are exposed to the portions of beamlets 36A-36D exhibiting at least the threshold intensity. Because four laterally displaced (i.e., displaced in the x-direction) beamlets 36A-36D are directed at layer of resin 34, four separate regions of resin 34 may be cured substantially simultaneously.

Figure 3A:
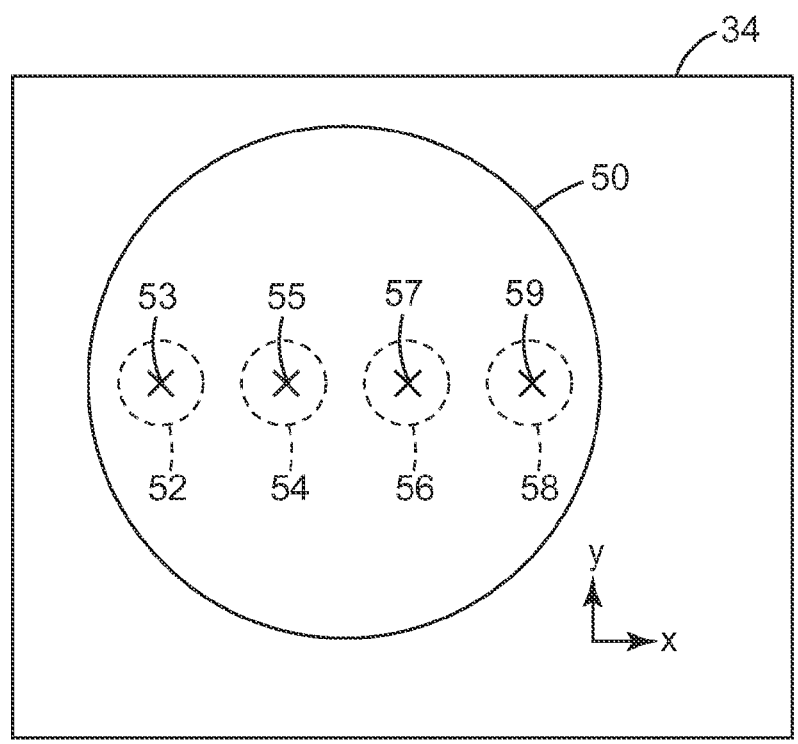
FIG. 3A illustrates a schematic representation of a field of view of a focusing lens of the optical system of FIG. 1B, where the field of view lies in an x-y plane that is substantially parallel to an x-y plane of an image plane.

FIG. 3A illustrates a schematic representation of field of view 50 of focusing lens 32, which lies in an x-y plane that is substantially parallel to an x-y plane of resin 34. Field of view 50 represents the area over which focusing lens 32 may focus beamlets 36A-36D. Within field of view 50 are subfields 52, 54, 56, and 58 (in phantom lines). Subfields 52, 54, 56, and 58 each define an area of layer of resin 34 in which individual focused beamlets 36A, 36B, 36C, and 36D, respectively, are scanned in the x-axis and y-axis directions. Subfields 52, 54, 56, and 58 thus define separate regions of layer of resin 34 that may be cured by each beamlet 36A-36D. However, in some embodiments, subfields 52, 54, 56, and 58 may overlap. In one embodiment, each subfield 52, 54, 56, and 58 may be assigned an x-y axis coordinate system in order to help control the x-y axes scanning of each beamlet 36A-36D. For example, the x and/or y coordinate of the focal point of each beamlet 36A-36D (i.e., the region of beamlets 36A-36D having sufficient intensity to cure resin 34) may be controlled within a respective subfields 52, 54, 56, and 58 via the respective coordinate system to selectively cure layer of resin 34 and fabricate voxels that may, for example, make-up a 3D structure. As previously described, telescope 22 adjusts a z-axis position of the focal point of beamlets 36A-36D.

Each beamlet 36A-36D focuses and cures a different region of resin 34 because each beamlet 36A-36D is directed at a different subfield 52, 54, 56 or 58, thereby enabling optical 13 to fabricate up to four 3D structures in parallel. In one embodiment, one structure may be created per subfield 40 because a single beamlet 36A, 36B, 36C or 36D focuses within one of subfields 52, 54, 56 or 58. For example, as FIG. 3A illustrates, beamlet 36A cures resin 34 within subfield 52 to fabricate structure 53 (schematically shown in FIG. 3A), beamlet 36B cures resin 34 within subfield 54 to fabricate structure 55 (schematically shown in FIG. 3A), beamlet 36C cures resin 34 within subfield 56 to fabricate structure 57 (schematically shown), and beamlet 36D cures resin 34 within subfield 58 to fabricate structure 59 (schematically shown). Of course, if desired, multiple structures may be created in one or more subfields 52, 54, 56 or 58. Furthermore, field of view 50 may define any suitable number of subfields, depending on the number of structures that optical system 13 fabricates. For example, as shown in FIG. 3A, the number of subfields 52, 54, 56, and 58 may be directly proportional to the number of structures 53, 55, 57, and 59 that optical system 13 is used to fabricate. However, in some embodiments, such proportionality is not present.

In addition to fabricating multiple structures 53, 55, 57, and 59 in parallel, optical system 13 may also be used to fabricate substantially identical structures 53, 55, 57, and 59 in parallel. As previously described, beamlets 36A-36D are substantially identical (e.g., each exhibit substantially similar energy and optical path lengths). Accordingly, each voxel making-up structures 53, 55, 57, and 59 are substantially identical in size. The ability of optical system 13 to fabricate multiple, substantially identical structures (e.g., 53, 55, 57, and 59) in parallel may be commercially significant for mass producing 3D microstructures and/or nanostructures.

Figure 3B:
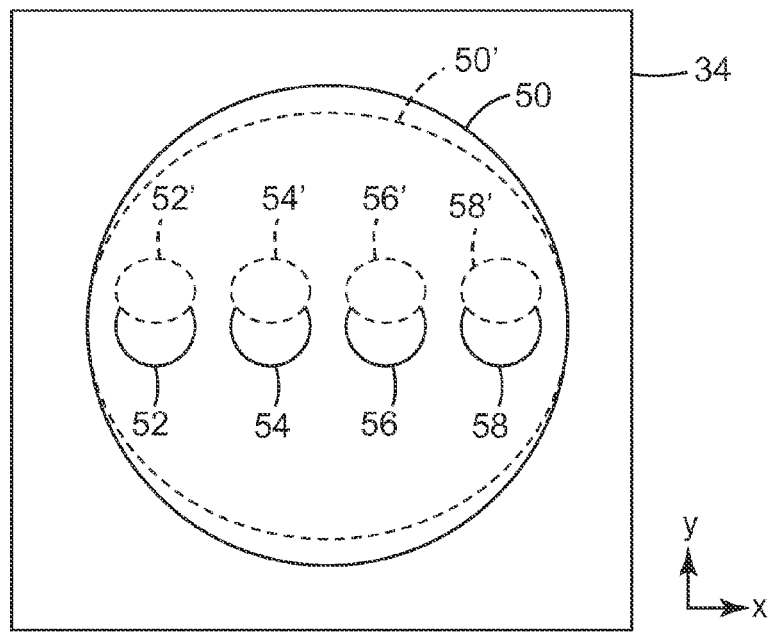
FIG. 3B illustrates a schematic representation of the field of view of FIG. 3A, where the field of view and subfields are displaced.

In one embodiment, an x-y plane of field of view 50 is preferably substantially parallel to an x-y plane of layer of resin 34 in order to maintain accuracy and precision of optical system 13. FIG. 3B illustrates field of view 50 and subfields 52, 54, 56, and 58, as well as a displaced field of view 50' (in phantom lines) and subfields 52', 54', 56', and 58' (in phantom lines), which may result if layer of resin 34 and field of view 50 are not substantially parallel (e.g., both in the x-y plane).

As FIG. 3B illustrates, displaced subfields 52', 54', 56', and 58' may align with a different region of layer of resin 34 than subfields 52, 54, 56, and 58, which may, in effect, narrow the total area of layer of resin 34 that may be cured by beamlets 36A-36D. For example, in the situation shown in FIG. 3B, displaced subfields 52', 54', 56', and 58' are shifted in the y-axis direction. If layer of resin 34 does not extend as far in the y-axis direction as the amount of shift of subfields 52', 54', 56', and 58', a part of subfields 52', 54', 56', and 58' may lie outside of layer of resin 34. Furthermore, beamlets 36A-36D may not properly align with subfields 52', 54', 56', and 58', and as a result, may be scanned outside of subfields 52', 54', 56', and 58'. In addition, displaced subfields 52', 54', 56', and 58' have a decreased area compared to subfields 52, 54, 56, and 58, thus limiting an area in which a beamlets 36A-36D may be scanned in the x-y plane.

Figure 3C:
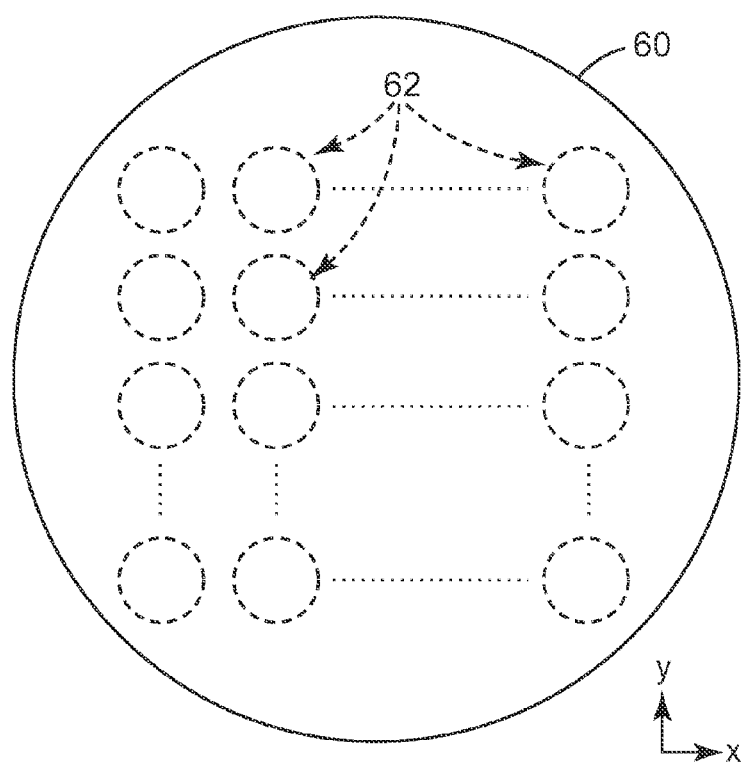
FIG. 3C illustrates another embodiment of a field of view of a focusing lens.

The larger field of view 50 of focusing lens 32, the larger number of subfields optical 13 may support, and thus, the larger the number of 3D structures optical 13 may fabricate in parallel. Although field of view 50 of focusing lens 32 is shown in FIG. 3A to include a linear array of four subfields 52, 54, 56, and 58, field of view 50 may include any number of subfields in any suitable arrangement. Furthermore, in alternate embodiments, subfields 52, 54, 56, and 58 may overlap. FIG. 3C illustrates an alternate embodiment of field of view 60, which includes a plurality of subfields 62 arranged in a 2D array comprising a plurality of rows and columns.

In one embodiment, focusing lens 32 is a Nikon CFI Plan Fluro 20× objective lens, which is available from Nikon Corporation of Tokyo, Japan. The Nikon 20× Multi Immersion Objective has a numeral aperture of 0.75 and a field of view of 1.1 millimeters (mm), which allows for at least 128 subfields each having a 60 μm diameter.

Optical system 13 of FIG. 1B may also include a confocal interface locator system, which may be used to locating and/or tracking an interface between layer of resin 34 and a substrate on which layer of resin 34 is disposed. An example of a suitable confocal interface located system is described in U.S. Patent Application Ser. No. 60/752,529, entitled, "METHOD AND APPARATUS FOR PROCESSING MULTIPHOTON CURABLE PHOTREACTIVE COMPOSITIONS," previously incorporated by reference.

In one embodiment, layer of resin 34 may have a curved profile (e.g., a cylindrical image plane), where the curvature is substantially flat over subfields 52, 54, 56, and 58. A one-dimensional array, such as the one shown in FIG. 3A, may be useful for writing on a cylindrical image plane.

Figure 3D:
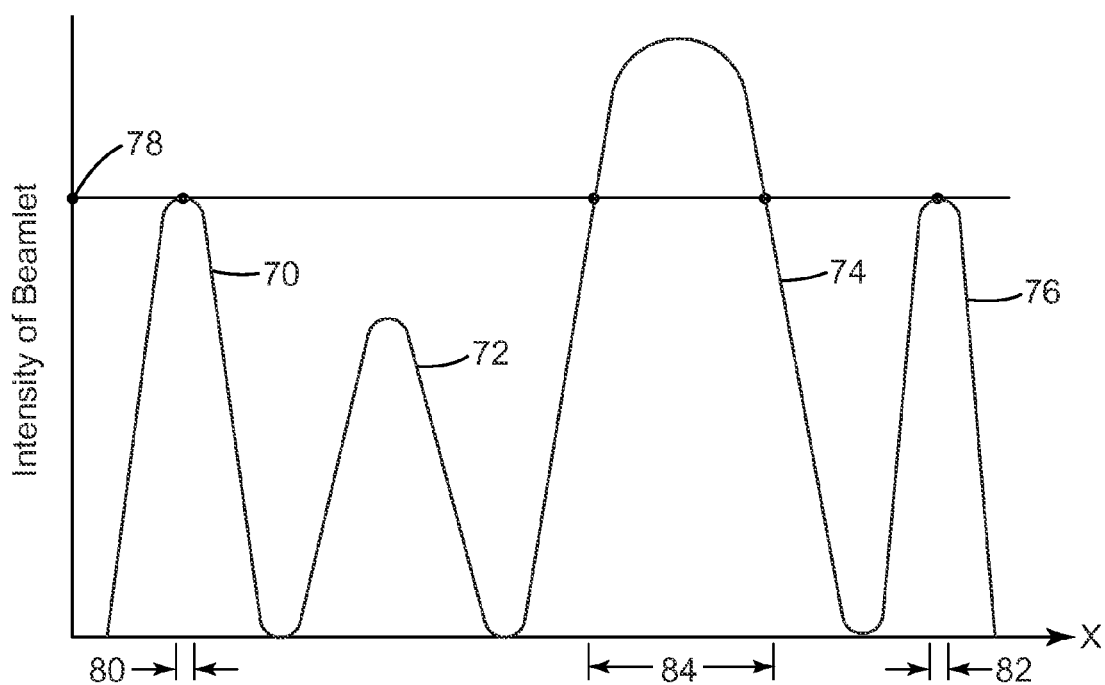
FIG. 3D is a graph illustrating a relationship between an intensity of a focus of a plurality of beamlets within a layer of resin and a size of a voxel formed by the respective beamlet.

FIG. 3D is a graph illustrating a relationship between an intensity of a focal point of each beamlet 36A-36D within layer of resin 34 and a size of a voxel formed by the respective beamlet 36A-36D, assuming an x-y plane of layer of resin 34 is substantially flat over field of view 50 (FIG. 3A). Line 70 corresponds to a focal point of beamlet 36A within subfield 52 of FIG. 3A, line 72 corresponds to a focal point of beamlet 36B within subfield 54, line 74 corresponds to a focal point of beamlet 36C within subfield 56, and line 76 corresponds to a focal point of beamlet 36D within subfield 58. As lines 70 and 76 illustrate, when a focal point of beamlets 36A and 36D, respectively, is at threshold intensity 78, voxel sizes 80 and 82 (along the x-axis of FIG. 3D) are substantially equal. Threshold intensity 78 is the minimum intensity level that is necessary to cure a region of layer of resin 34. Thus, when a focal point of beamlet 36B is below threshold intensity 78 (as indicated by line 72), there is no curing of layer of resin 34 by beamlet 36B because there is insufficient intensity to initiate the requisite photon absorption by resin 34.

When a focal point of beamlet 36C has a greater intensity than threshold intensity 78, voxel size 84 formed with layer of resin 34 by beamlet 36C is greater than voxel sizes 80 and 82 formed by beamlets 36A and 36D, respectively, because the width of the focal point of beamlet 36C at or above threshold intensity 78 is less than the width of the focal point of beamlets 36A and 36D. When forming a plurality of structures (e.g., structures 53, 55, 57, and 59 (shown in FIG. 3A) in parallel, it may be undesirable to have uneven sized voxels 80, 82, and 84. Thus, it is desirable for a focal point of each beamlet 36A-36D to be substantially equal to threshold intensity 78. Of course, in some embodiments, it may be desirable to fabricate uneven sized voxels 80, 82, and 84 in parallel.

Figure 3E:
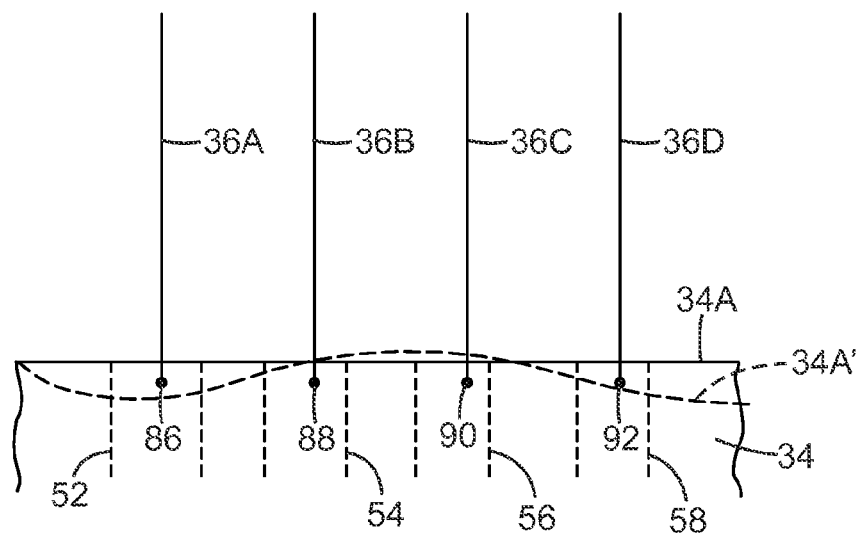
FIG. 3E is a schematic cross-sectional view illustrating a plurality of beamlets focusing with a layer of resin.

The size and location of the focal point of each beamlet 36A-36D within layer of resin 34 may also affect the amount of resin within layer of resin 34 that is cured by each beamlet 36A-36D, and thus, the voxel size formed by each beamlet 36A-36D. If substantially equal sized voxels are desired, it may be desirable for an x-y plane of layer of resin 34 to be substantially flat. If top surface 34A (in the x-y plane, as shown in FIG. 3E) of layer of resin 34 includes "waves" or other surface distortions, the focal point of each beamlet 36A-36D may differ within the respective subfield 52, 54, 56, and 58. Thus, a substantially flat layer of resin 34 may be desired in some embodiments in order to fabricate voxels in substantially the same x-y plane planes. Top surface 34A of layer of resin 34 is the surface of layer of resin 34 that is closest to focusing lens 32.

FIG. 3E is a schematic cross-sectional view of layer of resin 34, including top surface 34A, and illustrates beamlets 36A-36D that are each focusing within layer of resin 34. In particular, focal point 86 (i.e., a portion of beamlet 36A having sufficient intensity to cure resin 34) of beamlet 36A is focused within subfield 52 (in phantom lines), focal point 88 of beamlet 36B is focused within subfield 54 (in phantom lines), focal point 90 of beamlet 36C is focused within subfield 56 (in phantom lines), and focal point 92 of beamlet 36B is focused within subfield 58 (in phantom lines). With an even top surface 34A of layer of resin 34, each focal point 86, 88, 90, and 92 of beamlets 36A-36D, respectively, has substantially the same z-axis coordinate and substantially the same intensity. However, when layer of resin 34 has an uneven top surface 34A', top 34A' of layer of resin 34 has differing z-axis coordinates, which may affect the ability for foci 86, 88, 90, and 92 of beamlets 36A-36D to contact and cure layer of resin 34. For example, in the illustrative embodiment shown in FIG. 3E, focal point 86 of beamlet 36A does not contact layer of resin 34 because top layer 34A' is below focal point 86. However, focal points 88 and 90 of beamlets 36B and 36C, respectively, contact and cure regions of layer of resin 34 to form voxels have substantially similar z-axis coordinates.

In one embodiment, focusing lens 32 may include an autofocus feature to help adjust a focal point of beamlets 36A-36D to compensate for slight variances (e.g., uneven portions) within layer of resin 34.

FIG. 4 is a perspective view of beam splitter apparatus 100 in accordance with one embodiment of the invention. As further described in reference to FIGS. 5A AND 5B, beam splitter apparatus 100 is configured to receive an incident light beam (e.g., laser beam 36 of FIG. 1B), or another type of radiant energy beam, and split the incident light beam into a plurality of beamlets (e.g., beamlets 36A-36D of FIG. 1B) having substantially equal energy and optical path lengths. Due to manufacturing tolerances of the optical components of beam splitter apparatus 100 (e.g., beam splitter apparatus 102 and a plurality of prisms described below), the energy and optical path lengths between beamlets may differ slightly. Thus, the phrase "substantially equal" is used to describe energy and optical path lengths of beamlets. While beam splitter apparatus 100 is described below with respect to a laser beam, beam splitter apparatus 100 may also split other types of light beams into a plurality of beamlets.

Beam splitter apparatus 100 includes cube beam splitter 102 and cube prisms 104 (in phantom lines), 106 (in phantom lines), 108 (in phantom lines), 110 (in phantom lines), 112, and 114. Beam splitter 102 and prisms 104, 106, 108, 110, 112, and 114 may be formed of any suitable optical material, such as fused silica. Prisms 104, 106, 108, 110, 112, and 114 are in optical contact with beam splitter 102. That is, a beam of light may pass from beam splitter 102 to each of prisms 104, 106, 108, 110, 112, and 114 without substantial obstruction. While prisms 104, 106, 108, 110, 112, and 114 abut beam splitter 102 in the embodiment of beam splitter apparatus 100 shown FIG. 4, in alternate embodiments, prisms 104, 106, 108, 110, 112, and 114 may be distanced from beam splitter 102 while still being in optical contact therewith.

Cube beam splitter 102 is an optical device that splits a laser beam or beamlet into two beamlets exhibiting substantially equal energy, and may be a 50% energy beam splitter. In the embodiment illustrated in FIG. 4, cube beam splitter 102 is constructed of two triangular glass prisms 116 and 118 attached along seam 120. Triangular glass prisms 116 and 118 may be attached using any suitable means of attachment, such as a Canada balsam. When a laser beam or beamlet traverses seam 120, the beam splits into two or more beamlets. Therefore, seam 120 may also be referred to as a "splitter portion" of cube beam splitter 102.

Cube beam splitter 102 has a cubic shape, which includes sides 102A (in phantom lines), 102B (in phantom lines), 102C, 102D, 102E, and 102F, which are all substantially nonreflecting so that a laser beam or beamlet may pass through sides 102A-102F without substantial obstruction of the optical path. Side 102A of beam splitter 102 is substantially perpendicular to sides 102B and 102D, side 102B is substantially perpendicular to sides 102A and 102C, side 102C is substantially perpendicular to sides 102B and 102D, and side 102D is substantially perpendicular to sides 102A and 102C. Sides 102E and 102F are substantially parallel to each other and substantially perpendicular to sides 102A-D. Sides 102A-F of beam splitter 102 are approximately the same length (measured in the x-z plane). The x-y-z axes are shown in FIG. 4 in order to aid a description of beam splitter apparatus 100, and are not intended to limit the scope of the invention in any way. The x-y-z axes correspond with the x-y-z axes shown in FIG. 1B. In alternate embodiments, any beam splitter including substantially equal length sides may be substituted for beam splitter 102.

Prisms 104, 106, 108, 110, 112, and 114 are corner cube prisms, and in the embodiment shown in FIG. 4, have substantially similar dimensions. Prisms 104 and 106 are disposed along first side 102A of beam splitter 102, while prisms 108 and 110 are disposed along second side 102B of beam splitter 102, prism 112 is disposed along third side 102C of beam splitter 102, and prism 114 is disposed along fourth side 102D of beam splitter 102. The relative position/distances between prisms 104, 106, 108, 110, 112, and 114 are described in reference to FIG. 5B. In the embodiment shown in FIG. 4, prisms 104, 106, 108, 110, 112, and 114 are formed of the same material and thus, have substantially similar indices of refraction. In alternate embodiments, prisms 104, 106, 108, 110, 112, and 114 may be formed of different materials. Index matching fluid may be disposed between prisms 104, 106, 108, 110, 112, and 114 and cube beam splitter 102 in order to help prevent a light beam traveling between cube beam splitter 102 and one or more prisms 104, 106, 108, 110, 112, and 114 from reflecting back into cube beam splitter 102 or back into the respective prism 104, 106, 108, 110, 112, and 114, depending on the direction of travel of the light beam (or beamlets).

Figure 5B:
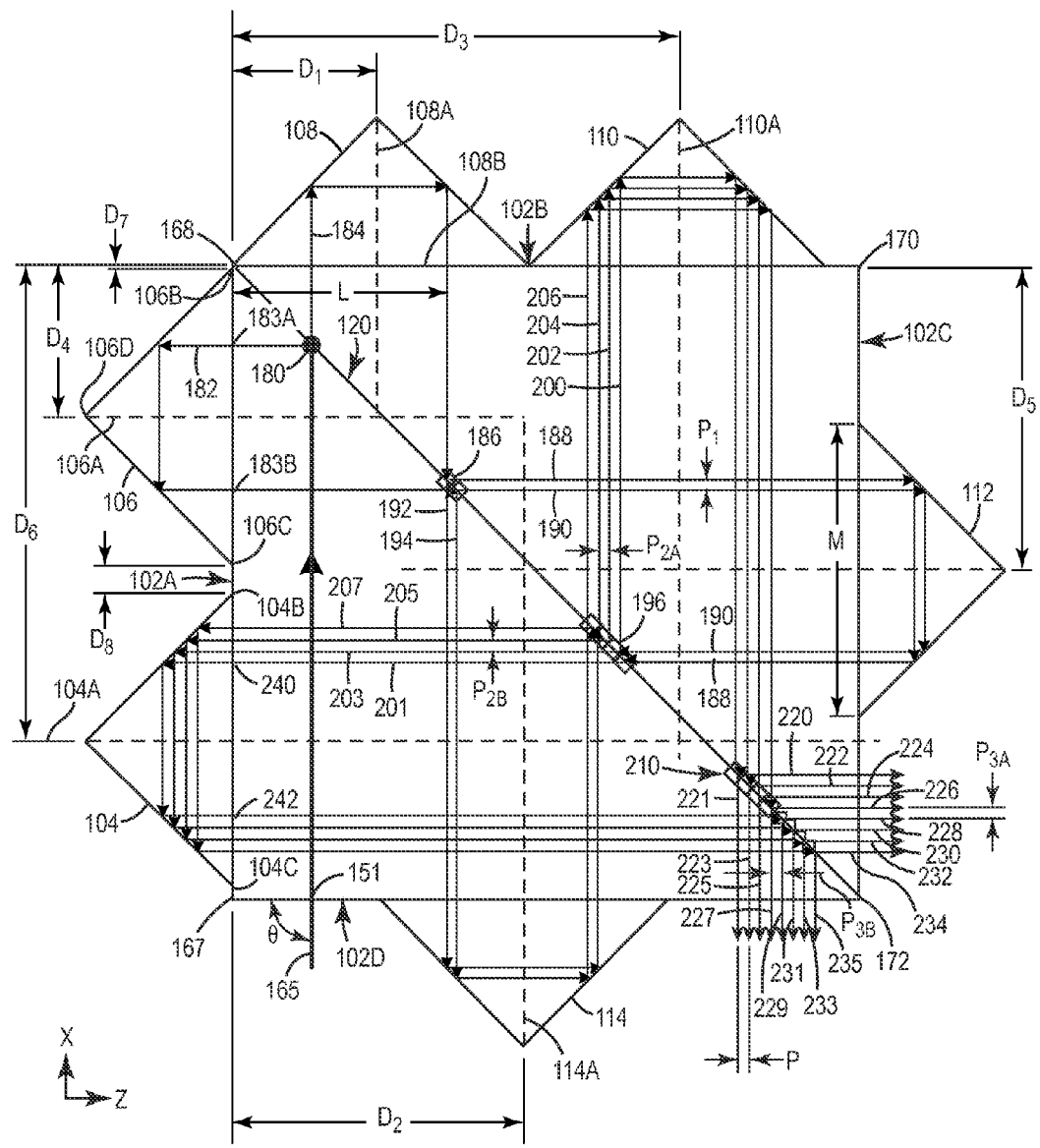
FIG. 5B is a schematic cross-sectional view of the beam splitter apparatus of FIGS. 4 and 5A, where an incident light beam is propagating through the beam splitter apparatus.

FIGS. 5A and 5B are schematic diagrams of beam splitter system 150 and beam splitter apparatus 100, respectively, in accordance with the invention for splitting a beam into multiple beamlets. System 150 includes beam splitter apparatus 100 (shown as a cross-section taken along line 5-5 in FIG. 4), laser beam source 152, and focusing portion 153, which includes mirrors 154 and 156, and triangular prisms 158, 160, 162, and 164. Laser beam source 152 may be any source of a laser beam, and may be, for example, laser beam source 14 of FIG. 1B, or may represent laser beam 36 reflecting off of mirror 17 in FIG. 1B.

In beam splitter system 150, laser beam 165 is emitted from laser beam source 152 and is directed at point 151 of cube beam splitter 102 of beam splitter apparatus 100. As described in further detail below, after laser beam 165 traverses beam splitter apparatus 100, laser beam 165 is split into sixteen beamlets 220-235, which focusing portion 153 arranges into linear array 166 of beamlets. Of course, in alternate embodiments, beam splitter apparatus 100 may be adapted to split laser beam 165 into a lesser or greater number of beamlets, including tens, hundreds or thousands of beamlets.

In one embodiment, laser beam 165 is directed at beam splitter 102 such that beam 165 is substantially perpendicular to side 102A of cube beam splitter 102. That is, angle θ between incident laser beam 165 and a surface of cube beam splitter 102 that laser beam 165 first contacts is about 90°. If angle θ is greater or less than 90°, beamlets 220-235 formed from laser beam 165 may be laterally displaced (i.e., displaced in the x-z plane). The difference between angle θ and 90° may be referred to as the "angle of incidence." The lateral displacement D may be approximated according to the following equation for small angles:

$$D = t * I * ((N-1)/N)$$

In the equation, t is a total optical path that a single beamlet traverses through beam splitter apparatus 100, I is the angle of incidence of laser beam 165, and N is the index of refraction of the material (e.g., glass) from which cube beam splitter 102 and prisms 104, 106, 108, 110, 112, and 114 are constructed. For example, if the angle of incidence I is about 1° (or about 0.01745 radians), t is about 224 mm, and N is 1.5, lateral displacement D of each of the beamlets 220-235 exiting beam splitter apparatus 100 is about 1.33 mm from an orthogonal exit position.

If laser beam 165 is laterally shifted from a nominal position (i.e., shifted along the z-axis from point 151), beamlets 220-235 that are outputted from beam splitter apparatus 100 will also be laterally shifted (in the case of beamlets 220-235, a lateral shift is in the x-axis direction) by the same amount. However, beam splitter apparatus 100 is arranged such that each of the beamlets formed from laser beam 165 traverse all of prisms 104, 106, 108, 110, 112, and 114 and exit apparatus 100 in a linear array 166, regardless of the angle of incidence of laser beam 165.

Furthermore, if incident laser beam is directed at beam splitter 100 at an angle other than orthogonal, beamlets 220-235 that exit beam splitter 100 may exhibit spherical aberrations if not collimated. In some embodiments, if the angle of incidence is small (e.g., about 1° or less), any aberrations that are added to beamlets 220-235 may be negligible. Furthermore, if beam splitter apparatus 100 is used in system 13 of FIG. 1B, an immersion lens may be used to reduce the spherical aberrations for an converging laser beam entering beam splitter 100.

As previously described, beam splitter apparatus 100 includes beam splitter 102 and plurality of prisms 104, 106, 108, 110, 112, and 114. Prisms 104, 106, 108, 110, 112, and 114 are shifted with respect to each other in order to achieve substantially equal optical path lengths, while still maintaining pitch P between adjacent beamlets 220-235. As shown in FIG. 5B, distances $D_1$-$D_6$ represent an exemplary arrangement between prisms 104, 106, 108, 110, 112, and 114 for creating beamlets 220-235 that traverse substantially equal optical path lengths through beam splitter apparatus 100, where pitch P between adjacent beamlets 220-235 is predetermined. In alternate embodiments, prisms 104, 106, 108, 110, 112, and 114 may be otherwise arranged to achieve beamlets 220-235 that traverse substantially equal optical path lengths through beam splitter apparatus 100.

Prisms 104, 106, and 112 are disposed along the x-axis direction (hereinafter referred to as "x-axis prisms"), while prisms 108, 110, and 114 are disposed along a z-axis direction (hereinafter referred to as "z-axis prisms"). The x-axis prisms are displaced in operative relation to each other, while the z-axis prisms are displaced in operative relation to each other. Furthermore, distances $D_4$-$D_6$ for x-axis prisms 104, 106, and 112 are selected based on the desired pitch P between beamlets 220-235 that are created by beam splitter apparatus 100.

With respect to z-axis prisms 108, 110, and 114, distance $D_1$ is measured in a z-axis direction from center axis 108A of prism 108 to side 102A of beam splitter 102. Distance $D_2$ is measured in the z-axis direction from center axis 114A of prism 114 to side 102A of beam splitter 100. Distance $D_3$ is measured in the z-axis direction from center axis 110A of prism 110 to side 102A of beam splitter 100. Distance $D_3$ is greater than distance $D_2$, which is greater than $D_1$.

In the embodiment shown in FIG. 5B, each distance $D_1$, $D_2$, and $D_3$ is calculated according to the following formula:

$$Z_n = \sum_{n=1}^{s-1} \frac{n \cdot L}{2}$$

$Z_n$ is the z-axis distance from side 102A of beam splitter 102 to the center axis of an $n^{th}$ z-axis prism from side 102A of beam splitter 102 (e.g., for prism 108, n=1; for prism 114, n=2; and for prism 110, n=3), L is the z-axis dimension of the side of the z-axis prism that is adjacent to beam splitter 102 (e.g., dimension L shown in FIG. 5B for side 108B of prism 108), and s is equal to the number of times incident beam 165 is split. The formula given above for calculating $Z_n$ assumes that all the z-axis prisms are substantially similar in size, and dimension L of each z-axis prism is greater than the total number of beamlets created by beam splitter apparatus 100 multiplied by pitch P between beamlets 220-235.

With respect to the x-axis prisms, distance $D_4$ is measured in an x-axis direction from center axis 106A of prism 106 to side 102B of beam splitter 102. Distance $D_5$ is measured in the x-axis direction from center axis 112A of prism 112 to side 102B of beam splitter 100. Distance $D_6$ is measured in the x-axis direction from center axis 104A of prism 104 to side 102B of beam splitter 100. Distance $D_6$ is greater than distance $D_5$, which is greater than $D_4$.

In the embodiment shown in FIG. 5B, each distance $D_1$, $D_2$, and $D_3$ is calculated according to the following formula:

$$X_n = \sum_{n=1}^{s-1} \frac{n \cdot M}{2} + P \cdot 2^{(n-2)}$$

$X_n$ is the x-axis distance from side 102B of beam splitter 102 to the center of an $n^{th}$ x-axis prism from side 102B of beam splitter 102 (e.g., for prism 106, n=1; for prism 112, n=2; and for prism 104, n=3), M is the x-axis dimension of the side of the x-axis prism that is adjacent to beam splitter 102 (e.g., dimension M for prism 112 shown in FIG. 5B), P is the pitch between beamlets 220-235 (as shown in FIG. 5B), and s is equal to the number of times incoming beam 165 is split. Pitch P between beamlets 220-235 is generally the spacing in the x-z plane between adjacent beamlets 220-235. A tolerance for pitch P is generally governed by the application of beam splitter apparatus 100. For example, if beamlets 220-235 are aligning with a microlens array, the pitch tolerance may be governed by the spacing between each microlens of the array, as well as the size of the microlenses. As with the formula above for calculating z-axis distance $Z_n$ from side 102A of beam splitter to the center of each x-axis prism, the formula given above for calculating $X_n$ assumes that all the x-axis prisms are substantially similar in size, and dimension L of each z-axis prism is greater than the total number of beamlets created by beam splitter apparatus 100 multiplied by pitch P between beamlets 220-235.

Side 102A of beam splitter 102 is merely used as a reference point for describing the spacing between z-axis prisms 108, 110, and 114, and side 102B is merely used as a reference point for describing the spacing between z-axis prisms 104, 106, and 112. It should be understood that the spacing between prisms 104, 106, 108, 110, 112, and 114 may also be described in reference to other portions of beam splitter apparatus 100, and even in reference to each other. However, for ease of description, sides 102A and 102B of beam splitter 102 are used as a reference point in the present description.

As FIG. 5B illustrates, beam splitting system 150 converts laser beam 165, which may be a collimated, converging, or diverging laser beam, emitted from laser beam source 152 into sixteen beamlets 220-235, each having substantially equal energy and each traveling substantially equal optical path lengths through beam splitter apparatus 100. More specifically, as laser beam 165 traverses splitter portion 120 of beam splitter 102 in region 180, laser beam 165 splits into beamlets 182 and 184. For example, when beam splitter 102 is a cube beam splitter formed from two triangular prisms and adhered together with Canada balsam at splitter portion 120, thickness T of the balsam at splitter portion 120 may be adjusted such that for a certain wavelength of light, half of laser beam 165 (i.e., beamlet 182) reflects about 90° toward prism 106 and the other half of laser beam 165 (i.e., beamlet 184) transmits through splitter portion 120 toward prism 108.

After beamlets 182 and 184 are formed from incident laser beam 165, beamlets 182 and 184 traverse a first prism passage. In particular, beamlet 182 traverses through prism 106 and beamlet 184 traverses through prism 108. In this first prism passage, beamlets 182 and 184 travel substantially equal optical path lengths through beam splitter 102 and prisms 106 and 108, respectively, regardless of what region of splitter portion 120 laser beam 165 traverses to split into beamlets 182 and 184, and regardless of where beamlets 182 and 184 enter prisms 106 and 108, respectively. The substantially equal optical path lengths are attributable to many factors, including equal length sides 102A-102F of beam splitter 102, the substantially equal dimensions of prisms 106 and 108, and the configuration of beam splitting apparatus 100 to include prisms 106 and 108 that are disposed with respect to sides 102B and 102A, respectively, of beam splitter 102 according to the formulas given above for calculating $X_n$ and $Z_n$, respectively.

Also contributing to the substantially equal optical path lengths between beamlets 182 and 184, as well beamlets formed in the other prism passages is the symmetry of each cube prism 104, 106, 108, 110, 112, and 114. An incident light beam enters each cube prism 104, 106, 108, 110, 112, and 114 at a first point and exits the cute prism 104, 106, 108, 110, 112 or 114 at a second point, where the first and second points are substantially equidistant from a reference point. For example, with cube prism 106, the reference point is apex 106D. Taking beamlet 182 as an illustrative example, beamlet 182 enters cube prism 106 at point 183A and exits at point 183B. Points 183A and 183B are substantially equidistant from apex 106D of cube prism 106. A similar reference point can be found for prisms 106, 108, 110, 112, and 114.

In an alternate embodiment, rather than having substantially equal optical path lengths, a predetermined path difference between beamlets in each of the prism passages may be introduced by adjusting the dimensions of cube beam splitter 102 (i.e., substituting a beam splitter having unequal sides for beam splitter 102), the relative spacing between cube beam splitter 102 and at least one of corner cubes 104, 106, 108, 110, 112 or 114 (e.g., the relative spacing between surface 102B of cube beam splitter 102 and surface 108B of prism 108).

After exiting prisms 106 and 108, beamlets 182 and 184, respectively, traverse splitter portion 120 of beam splitter 102 at region 186, thereby splitting into four beamlets 188, 190, 192, and 194. Thereafter, beamlets 188, 190, 192, and 194 traverse through a second prism passage. In the second prism passage, beamlets 188 and 190 reflect about 90° from splitter portion 120 toward prism 112 and beamlets 192 and 194 transmit through splitter portion 120 toward prism 114. Again, due to the arrangement of prisms 112 and 114 and because prisms 112 and 114 have substantially similar dimensions, beamlets 188, 190, 192, and 194 travel substantially equal optical path lengths through the respective prisms 112 and 114.

Upon exiting the respective prisms 112 and 114, beamlets 188, 190, 192, and 194 traverse splitter portion 120 of beam splitter 102 at region 196 and split into eight beamlets 200-207. In particular, beamlet 188 splits into beamlets 200 and 201, beamlet 190 splits into beamlets 202 and 203, beamlet 192 splits into beamlets 204 and 205, and beamlet 194 splits into beamlets 206 and 207. In a third prism passage, beamlets 200, 202, 204, and 206 subsequently traverse prism 110, while beamlets 201, 203, 205, and 207 subsequently traverse prism 114. As with the previous prism passages, in the third prism passage, beamlets 200-207 traverse substantially equal optical path lengths through beam splitter apparatus 100.

After traversing through the respective prisms 110 and 114, beamlets 200-207 once again traverse splitter portion 120 of beam splitter 102 and further split into a total of sixteen beamlets 220-235. In particular, beamlet 200 splits into beamlets 220 and 221, beamlet 201 splits into beamlets 222 and 223, beamlet 202 splits into beamlets 224 and 225, beamlet 203 splits into beamlets 226 and 227, beamlet 204 splits into beamlets 228 and 229, beamlet 205 splits into beamlets 230 and 231, beamlet 206 splits into beamlets 232 and 233, and beamlet 207 splits into beamlets 234 and 235.

Focusing portion 153 (shown in FIG. 5A) recombines beamlets 220-235 into array 166 of beamlets. Arranging beamlets 220-235 into an array 166 may be desirable in some applications of beam splitter apparatus 100. For example, if beam splitter apparatus 100 is incorporated into an optical system 13 of FIG. 1B, beamlets 220-235 may be arranged to align with microlenses in a microlens array (e.g., microlens array 21 of FIG. 1B).

As previously described, focusing portion 153 includes mirrors 154 and 156, and triangular prisms 158, 160, 162, and 164. Mirror 154 adjusts direction of beamlets 220, 222, 224, 226, 228, 230, 232, and 234 in the x-z plane. Beamlets 220, 222, 224, 226, 228, 230, 232, and 234 subsequently traverse prism 158, which reorients beamlets 220, 222, 224, 226, 228, 230, 232, and 234 about 90° toward prism 160. Mirror 156 adjusts direction of beamlets 221, 223, 225, 227, 229, 231, 233, and 235 in the x-z plane to orient beamlets 221, 223, 225, 227, 229, 231, 233, and 235 toward prism 164. Beamlets 221, 223, 225, 227, 229, 231, 233, and 235 subsequently traverse prism 164, which reflects beamlets 221, 223, 225, 227, 229, 231, 233, and 235 about 90° toward prism 162. Prisms 160 and 162 are disposed adjacent to one another such that when beamlets 220-235 pass through the respective prism 160 and 162, beamlets 220-235 each pivot about 90° and are arranged substantially adjacent to one another into linear array 166 of beamlets.

In alternate embodiments, focusing portion 153 may include other configurations and components in order to arrange beamlets 220-235 into an array of beamlets. Furthermore, beam splitter apparatus 100 may be used to form beamlets 220-235 in arrangements other than linear arrays, such as a 2D array (e.g., a rectangular array). In order to achieve a 2D array, x-axis prisms 104, 106, and 112 may be displaced in the y-axis direction (perpendicular to the plane of the image). Alternatively, focusing portion 153 include optical components (e.g., mirrors and/or prisms) that are configured to arrange beamlets 220-235 into a 2D array.

While in the embodiment shown in FIG. 5B, beamlets 220-235 are in phase, in alternate embodiments, beamlets 220-235 are not in phase. This may be achieved, for example, by other external optics and other configurations of focusing portion 153.

Pitch $P_1$ is also equal to the pitch between beamlets 188 and 190, as well as between beamlets 192 and 194. In one embodiment, distance $D_7$ is substantially equal to about one-half pitch $P_1$ (i.e., $\frac{1}{2}P_1$). In order to change pitch $P_1$, distances $D_1$ and $D_4$ may be changed relative to each other. In order to change pitch $P_{2A}$, which is the lateral spacing between a first pair of beamlets 200 and 202 and a second pair of beamlets 204 and 206, distances $D_2$ and $D_5$ may be adjusted relative to each other. Distances $D_2$ and $D_5$ may also be adjusted relative to each other in order to change pitch $P_{2B}$ between a first pair of beamlets 201 and 203 and a second pair of beamlets 205 and 207. Distances $D_3$ and $D_6$ may also be adjusted relative to each other in order to change pitch $P_{3A}$ between a first quadruplet of beamlets 221, 223, 225, and 227 and a second quadruplet of beamlets 229, 231, 233, and 235. Adjustment of distances $D_3$ and $D_6$ also changes pitch $P_{3B}$ between a first quadruplet of beamlets 220, 222, 224, and 226 and a second quadruplet of beamlets 228, 230, 232, and 234. In the embodiment shown in FIG. 5B, pitches P, $P_1$, $P_{2A}$, $P_{2B}$, $P_{3A}$, $P_{3B}$ are substantially equal. In the embodiment shown in FIG. 5B, distance D8 is substantially equal to about 1.5P.

The exemplary relationship between a distance between prisms in sequential prism passages and a pitch of beamlets created subsequent to the prism passage in the sequence may be repeated for additional prism passages.

Alternatively, pitch P between beamlets 220-235 may also be adjusted by placing a layer of index matching fluid between nonreflecting side 102A of beam splitter 102 and prisms 104 and 106, between nonreflecting side 102B of beam splitter 102 and prisms 108 and 110, between nonreflecting side 102C of beam splitter 102 and prism 112, and between nonreflecting side 102D of beam splitter 102 and prism 114. This enables pitch P between beamlets 200-235 to be adjusted without disassembling of beam splitter apparatus 100.

While beamlets 220-235 in array 166 are substantially parallel and do not interfere with each other, in some applications, such as in some metrology applications, it may be desirable for at least two of beamlets 220-235 to interfere. Thus, in alternate embodiments, the pitch between two or more beamlets 220-235 may be adjusted such that two or more beamlets 220-235 partially or completely overlap to create interference.

In alternate embodiments, beam splitter apparatus 100 may include a fewer or greater number of prisms 104, 106, 108, 110, 112, and 114 in order to split incident laser beam 165 into a fewer or greater number of beamlets. With beam splitter apparatus 100, 2D arrays having $2^n$ beamlets may be formed, where n is equal to the number of times incident laser beam 165 traverses splitter portion 120 of beam splitter 102. In order to achieve an even number of beamlets, (2*n)−2 prisms are required. Thus, if 32 beamlets are desired, beam splitter apparatus includes eight prisms. That is:

32 beamlets=$2^n$=$2^5$ (thus, n=5)

Number of prisms required=(2*n)−2=(2*5)−2=8

If additional prisms are added to beam splitter apparatus 100, the x-axis prisms may be spaced according to the formula above for calculating $X_n$ while the z-axis prisms may be spaced according to the formula above for calculating $Z_n$.

While cube prisms are shown in the embodiment of FIGS. 4-5B, other types of prisms may be substituted for cube prisms 104, 106, 108, 110, 112, and 114 in other embodiments. In general, in a suitable prism, an incident light beam enters prism at a first point and exits the prism at a second point, where the first and second points are substantially equidistant from a reference point. For example, with cube prism 104, the reference point is point 104A. Taking beamlet 201 as an illustrative example, beamlet 201 enters prism 104 at point 240 and exits at point 242. Points 240 and 242 are substantially equidistant from point 104A of prism 104. Other suitable prisms including this feature include, but are not limited to, pentaprisms (shown in FIG. 6) or porroprisms.

Figure 6:
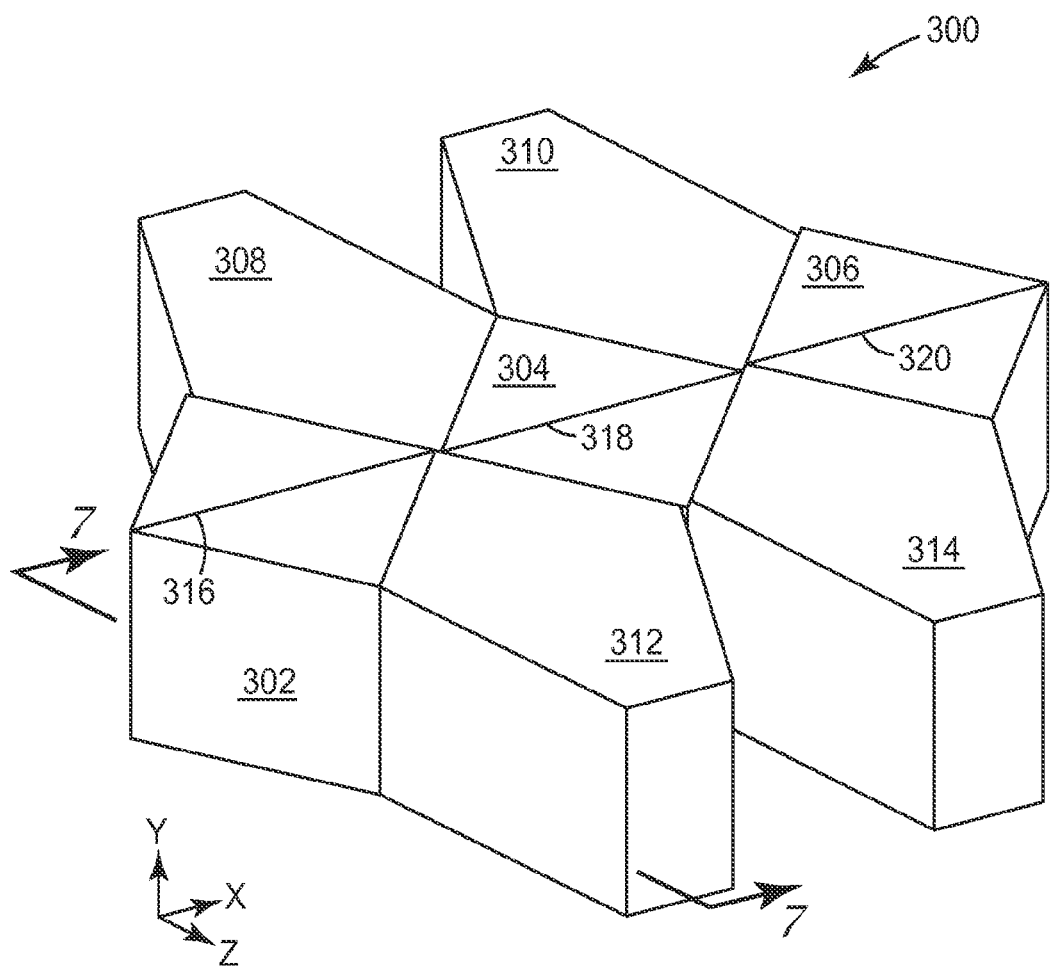
FIG. 6 is a perspective view of another embodiment of a beam splitter apparatus in accordance with the invention.

FIG. 6 illustrates beam splitter apparatus 300 in accordance with another embodiment of the invention, which includes three beam splitters 302, 304, and 306, and four pentaprisms 308, 310, 312, and 314 disposed about beam splitters 302, 304, and 306. In one embodiment, beam splitters 302, 304, and 306 are identical to one another, and may each be similar to 50% energy cube beam splitter 102 of beam splitter apparatus 100 of FIGS. 4-5B. In alternate embodiments, beam splitters 302, 304, and 306 may be any another type of beam splitter that includes substantially equal length sides (measured in the x-z plane). For example, in the embodiment shown in FIG. 6, sides 302A, 302B, 302C, and 302D of beam splitter 302 are substantially equal in length, sides 304A, 304B, 304C, and 304D of beam splitter 304 are substantially equal in length, and sides 306A, 306B, 306C, and 306D of beam splitter 306 are substantially equal in length.

Beam splitter 302 includes splitter portion 316, which may be, for example, a seam at which two triangular prisms are attached to form beam splitter 302. Similarly, beam splitter 304 includes splitter portion 318, and beam splitter 306 includes splitter portion 320. In the embodiment shown in FIG. 6, beam splitters 302, 304, and 306 are disposed adjacent to each other, but splitter portions 316, 318, and 320 are shifted with respect to each other in the x-z plane. The shift between splitter portions 316, 318, and 320 results from a shift between prisms 308, 310, 312, and 314, as described in further detail below in reference to FIG. 7B.

Pentaprisms 308, 310, 312, and 314 are each five-sided prisms. As described in reference to FIGS. 7A and 7B, a beam of light reflects against two sides of prism 308, 310, 312 or 314, which allows the beam to deviate by about 90°. Pentaprisms 308, 310, 312, and 314 are arranged about cube prisms 302, 304, and 306 such that in each prism passage, beamlets traverse substantially similar optical path lengths through beam splitter apparatus 300. The arrangement between pentaprisms 308, 310, 312, and 314 and beam splitters 302, 304, and 306 is described in reference to FIG. 7B.

FIG. 7A is a schematic diagram of beam splitter system 350 in accordance with the invention for splitting a beam into multiple beamlets. System 350 includes beam splitter apparatus 300 (shown as a cross-section taken along line 7-7 in FIG. 6), laser beam source 352, focusing lens 353, an immersion lens (not shown), focusing portion 356, which includes a first set of lenses 358 and 360, mirrors 362 and 364, a second set of lenses 366 and 368, and triangular mirrors 370 and 372. In the embodiment shown in FIG. 7A, laser beam source 352 emits converging laser beam 374. In alternate embodiments, laser beam source 352 may be any source of a radiant energy light beam.

In beam splitter system 350, converging laser beam 374 having a relatively low numerical aperture (NA) (e.g., less than or equal to about 0.04) is emitted from laser beam source 352 and is directed at cube beam splitter 302 of beam splitter apparatus 300. Converging laser beam 374 is comprised of a plurality of converging beams that pass through converging lens 353 in order to converge into a single laser beam, which is eventually split into a plurality of beamlets 400-407. Depending on a distance between laser beam source 352 and beam splitter system 300, converging laser beam 374 may be split into a plurality of converging beamlets that converge into focused beamlets after exiting beam splitter apparatus 300. More specifically, after traversing beam splitters 302, 304, and 306 and pentaprisms 308, 310, 312, and 314, laser beam 374 is split into eight beamlets 400-407 exhibiting substantially equal energy. Furthermore, each of the eight beamlets traverses a substantially equal path length through beam splitter apparatus 300. Focusing portion 356 arranges beamlets 400-407 that are outputted from beam splitter apparatus 300 into linear array 376 of focused beamlets. As a result, if beamlets 400-407 are used in an optical system (e.g., optical system 13 of FIG. 1B), a microlens array may not be necessary to focus beamlets 400-407.

Figure 7B:
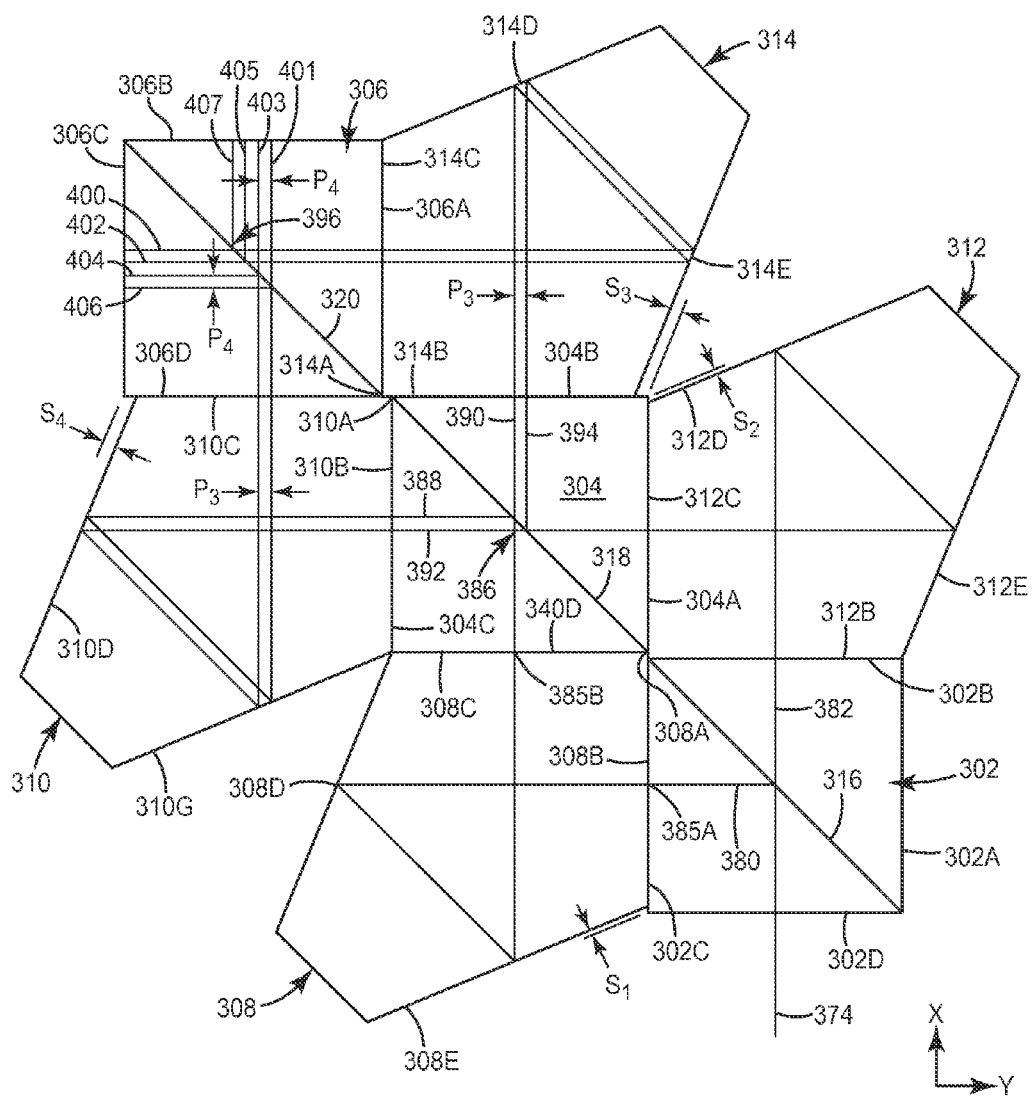
FIG. 7B is a schematic cross-sectional view of the beam splitter apparatus of FIGS. 6 and 7A, where an incident light beam is propagating through the beam splitter apparatus.

As shown in FIG. 7B, after laser beam 374 is directed into beam splitter 302, laser beam 374 traverses splitter portion 316 of beam splitter 302 and splits into beamlets 380 and 382. Beamlet 380 pivots about 90° in the x-z plane from direction 384 of incident laser beam 374, while beamlet 382 passes through splitter portion 316 in direction 384 toward pentaprism 312. Subsequently, in a first prism passage, beamlet 380 traverses through pentaprism 308, and beamlet 382 traverses through pentaprism 312. More specifically, beamlet 380 enters prism 308 through side 308B, reflects off of side 308D of pentaprism 308, pivots about 45° and reflects off of side 308E, and exits prism 308 through side 308C. Beamlet 382 similarly traverses pentaprism 312 by entering prism 312 through side 312B, reflects off of side 312D, pivots about 45° and reflects off of side 312E, and exits prism 312 through side 312C.

As with cube prisms 104, 106, 108, 110, 112, and 114, an incident light beam enters a pentaprism (e.g., pentaprisms 308, 310, 312 or 314) at a first point and exits the prism at a second point, where the first and second points are substantially equidistant from a reference point. For example, with pentaprism 308, the reference point is apex 308A. Taking beamlet 380 as an illustrative example, beamlet 380 enters pentaprism 308 at point 385A and exits at point 385B. Points 385A and 385B are substantially equidistant from apex 308A of pentaprism 308. A similar reference point can be found for prisms 310, 312, and 314.

After exiting prisms 308 and 312, beamlets 380 and 382, respectively, traverse region 386 of splitter portion 318 of beam splitter 306. After traversing splitter portion 318 of beam splitter 306, beamlets 380 splits into beamlets 388 and 390 and beamlet 382 splits into beamlets 392 and 394. In a second prism passage, beamlets 388 and 392 traverse through pentaprism 310, while beamlets 390 and 394 traverse through pentaprism 314. In particular, beamlets 388 and 392 each enter prism 310 through side 310B, reflects off of side 310D, pivot about 45° and reflects off of side 310E, and exits prism 310 through side 310C. Beamlets 390 and 394 each enter prism 314 through side 314B, reflects off of side 314D, pivot about 45° and reflects off of side 314E, and exits prism 314 through side 314C.

After exiting the respective prisms 310 and 314, beamlets 388, 390, 392, and 394 traverse region 396 of splitter portion 320 of prism 306 and further split into a total of eight beamlets 400-407. Beamlet 388 splits into beamlets 400 and 401, beamlet 390 splits into beamlets 402 and 403, beamlet 392 splits into beamlets 404 and 405, and beamlet 392 splits into beamlets 406 and 407.

As shown in FIG. 7A, focusing portion 356 arranges beamlets 400-407 into array 376 of beamlets that may be, for example, introduced into a microlens array (e.g., microlens array 21 of FIG. 2) for use in a multiphoton photopolymerization fabrication process. First set of lenses 358 and 360 collimate and redirect beamlets 400-407 onto a respective mirror 362 and 364. In particular, beamlets 400, 402, 404, and 406 traverse lens 358 and are collimated and redirected onto mirror 362, while beamlets 401, 403, 405, and 407 traverse lens 360 and are collimated and redirected onto mirror 360. Beamlets 400, 402, 404, and 406 reflect off of mirror 362 and beamlets 401, 403, 405, and 407 reflect off of mirror 364. Mirrors 362 and 364 reflect the respective beamlets 400-407 toward second set of lenses 366 and 368, which focus beamlets 400-407. Beamlets 400-407 are focused because beamlets 400-407 were previously collimated by lenses 358 and 360.

After traversing lens 366, beamlets 400, 402, 404, and 406 reflect from triangular mirror 370. After traversing lens 368, beamlets 401, 403, 405, and 407 reflect from triangular mirror 372. Mirrors 370 and 372 are disposed adjacent to one another such as beamlets 400-407 reflect from the respective triangular mirror 370 and 372, beamlets 400-407 each pivot about 90° and are arranged substantially adjacent to one another into linear array 376 of beamlets.

As with focusing portion 153 of beam splitter system 150 of FIGS. 5A, focusing portion 356 may include other configurations and components in order to arrange beamlets 400-407 into an array of beamlets. For example, flat mirrors may be substituted for triangular mirrors 370 and 372 for reflecting beamlets 400-407 about 90°. Furthermore, focusing portion 356 may arrange beamlets 400-407 into other arrangements, such as a 2D array or another non-linear array.

In order for beamlets in each prism passage to traverse substantially equal optical path lengths through beam splitter 300, and in order to achieve a desired pitch $P_4$ between beamlets 400-407, there is a small shift between pentaprisms 308, 310, 312, and 314. The shift is best described with reference to beam splitters 302, 304, and 306. In the arrangement shown in FIG. 6, apex 308A of pentaprism 308 and apex 312A of pentaprism 312 are unaligned. As a result, nonreflecting side 312B of pentaprism 312 is aligned with and adjacent to side 302B of beam splitter 302, while nonreflecting side 308B pentaprism 308 is shifted distance $S_1$ with respect to side 302C of beam splitter 302. Shift distance $S_1$ may also be referred to as the "shift distance" between pentaprisms 308 and 312. Nonreflecting side 308C of pentaprism 308 and side 304D of beam splitter 304 are also aligned and adjacent to each other, while nonreflecting side 312C of pentaprism 312 is shifted distance $S_2$ with respect to side 304A of beam splitter 304. Distances $S_1$ and $S_2$ are substantially equal because beam splitters 302 and 304 are substantially equal in dimension and pentaprisms 308 and 312 are substantially equal in dimension. Distances $S_1$ and $S_2$ are selected based on the desired pitch $P_3$ between beamlets 388 and 392 after the first prism passage. Pitch $P_3$ is also equal to the pitch between beamlets 390 and 394. Generally, distances $S_1$ and $S_2$ are each substantially equal to $P_3$.

Pentaprisms 310 and 312 are also shifted with respect to each other. More specifically, apex 310A of pentaprism 310 and apex 314A of pentaprism 314 are unaligned. As a result, nonreflecting side 310B of pentaprism 310 is aligned with and adjacent to side 304C of beam splitter 304, while nonreflecting side 314B pentaprism 314 is shifted distance $S_3$ with respect to side 304B of beam splitter 304. Shift distance $S_3$ may also be referred to as the shift distance between pentaprisms 308 and 312. Nonreflecting side 314C of pentaprism 314 and side 306A of beam splitter 306 are also aligned and adjacent to each other, while nonreflecting side 310C of pentaprism 310 is shifted distance $S_4$ with respect to side 304A of beam splitter 304. Distances $S_3$ and $S_4$ are substantially equal because beam splitters 304 and 306 are substantially equal in dimension and pentaprisms 310 and 314 are substantially equal in dimension. Distances $S_3$ and $S_4$ are selected based on the desired relative pitch between $P_3$ and $P_4$ between beamlets 400, 402, 404, and 406, which is also equal to the pitch between beamlets 401, 403, 405, and 407. In the embodiment shown in FIG. 7B, pitch $P_4$ is substantially equal to pitch $P_3$. Generally, distances $S_3$ and $S_4$ are each substantially equal to $P_4$.

In alternate embodiments, beam splitter apparatus 300 may split laser beam 374 into more than eight beamlets. For example, an additional beam splitter and pentaprism "set" may be added prior to focusing portion 356 in order to add an additional prism passage for beamlets 400-407 to traverse. A beam splitter and pentaprism set is a beam splitter, one pentaprism disposed adjacent to the beam splitter, and one pentaprism shifted with respect to the beam splitter, where the shift distance is generally equal to the pitch between beamlets following the prism passage. For example, in FIG. 7B, beam splitter 306 and pentaprisms 310 and 314 constitute a beam splitter and pentaprism set. In the embodiment shown in FIG. 7B, adding a beam splitter and pentaprism set increases the number of beamlets by a factor of two.

The present invention described herein relates to a beam splitter apparatus that includes one or more beam splitters and a plurality of prisms disposed about the one or more beam splitters in an arrangement that allows beamlets formed by the one or more beam splitters to traverse substantially equal optical path lengths through the beam splitter apparatus. Furthermore, the beam splitters split a laser beam into beamlets exhibiting substantially equal energy.

Various embodiments of the invention have been described. These and other embodiments are within the scope of the following claims.

The invention claimed is:

1. A system comprising:
a light source to provide an incident light beam; and
a beam splitter apparatus to split the incident light beam into at least ($2^n-1$) beamlets, n being at least 3, wherein the beam splitter apparatus comprises:
a beam splitter; and
(2n−2) prisms in optical contact with the beam splitter; wherein the beam splitter is a cube beam splitter comprising:
a first side;
a second side perpendicular to the first side;
a third side perpendicular to the second side; and
a fourth side perpendicular to the first side, and wherein the (2n−2) prisms comprises:
a first prism member positioned along the first side of the cube beam splitter;
a second prism member positioned along the second side of the cube beam splitter;
a third prism member positioned along the third side of the cube beam splitter;
a fourth prism member positioned along the fourth side of the cube beam splitter.

2. The system of claim 1, and further comprising:
a fifth prism member positioned along the first side of the cube beam splitter adjacent to the first prism member; and
a sixth prism member positioned along the second side of the cube beam splitter adjacent to the second prism member.

3. A system comprising:
a light source to provide an incident light beam
a beam splitter apparatus to split the incident light beam into at least ($2^n-1$) beamlets, n being at least 2, wherein the beam splitter apparatus comprises:
a beam splitter; and
(2n−2) prisms in optical contact with the beam splitter;
a layer of a multiphoton curable photoreactive composition; and
a focusing lens defining a field of view within the layer, the field of view comprising a plurality of subfields, wherein at least one of the beamlets cures a region of the layer within at least one of the subfields.

4. An apparatus comprising:
a beam splitter configured to split an incident light beam into a first beamlet and a second beamlet;
a first prism member configured to reflect the first beamlet into the beam splitter, wherein the first beamlet traverses the beam splitter and splits into a third beamlet and a fourth beamlet;
a second prism member configured to reflect the second beamlet into the beam splitter, wherein the second beamlet traverses the beam splitter and splits into a fifth and sixth beamlet;
a third prism member configured to reflect the third and fifth beamlets into the beam splitter; and
a fourth prism member configured to reflect the fourth and sixth beamlets into the beam splitter, wherein the first, second, third, and fourth prisms are arranged to achieve a predetermined path difference between the third, fourth, fifth, and sixth beamlets.

5. The apparatus of claim 4, wherein the predetermined path difference is zero.

6. The apparatus of claim 4, wherein the first and second beamlets travel substantially equal path lengths through the first and second prism members, respectively, the third and fifth beamlets each travel an equal path length through the fourth prism member, and the fourth and sixth beamlets each travel an equal path length through the fourth prism member.

7. The apparatus of claim 4, wherein the beam splitter is a cube beam splitter.

8. The apparatus of claim 4, wherein after the third and fifth beamlets exit the third prism member, the third and fifth beamlets traverse the beam splitter, and the third beamlet splits into a seventh and eighth beamlet, the fourth beamlet splits into a ninth and tenth beamlet, and wherein after the fourth and sixth beamlets exit the third prism member, the fourth and sixth beamlets traverse the beam splitter, and the fifth beamlet splits into an eleventh and twelfth beamlet, and the sixth beamlet splits into a thirteenth and fourteenth beamlet.

9. The apparatus of claim 8, and further comprising:
a fifth prism member configured to reflect the seventh, ninth, eleventh, and thirteenth beamlets into the beam splitter, the seventh, ninth, eleventh, and thirteenth beamlets each traveling an equal path length through the fifth prism member; and
a sixth prism member configured to reflect the eighth, tenth, twelfth, and fourteenth beamlets into the beam splitter, the eighth, tenth, twelfth, and fourteenth beamlets each traveling an equal path length through the sixth prism member.

10. The apparatus of claim 4, and further comprising:
a layer of index matching fluid disposed between each of the plurality of prism members and the beam splitter.

11. The apparatus of claim 4, wherein each of the plurality of prism members is selected from a group consisting of: a cube prism, a pentaprism, and a porroprism.

12. The apparatus of claim 4, and further comprising:
a focusing portion configured to arrange the third, fourth, fifth, and sixth beamlets into an array of beamlets, the array being one of a linear array or a two-dimensional array of beamlets.

13. The apparatus of claim 4, wherein the first and third prism members are separated by a distance calculated according to a first formula:

$$Z_n = \sum_{n=1}^{S-1} \frac{n \cdot L_z}{2}$$

and the second and fourth prism members are separated by a distance calculated according to a second formula:

$$X_n = \sum_{n=1}^{s-1} \frac{n \cdot L_x}{2} + P \cdot 2^{(n-2)}.$$

14. The apparatus of claim 4, wherein a first distance between the first and third prism members determines a first pitch between the third and fourth beamlets, and a second distance between the second and fourth prism members determines a second pitch between the fifth and sixth beamlets.

15. The apparatus of claim 14, wherein the first and second pitch are substantially equal.

16. An optical apparatus for splitting an incident light beam into a plurality of beamlets, the optical apparatus comprising:
   a first cube beam splitter comprising a first splitter portion;
   a second cube beam splitter comprising a second splitter portion;
   a third cube beam splitter comprising a third splitter portion;
   a first pentaprism disposed between the first and second cube beam splitters;
   a second pentaprism disposed between the first and second beam splitters and opposing the first pentaprism;
   a third pentaprism disposed between the second and third beam splitters; and
   a fourth pentaprism disposed between the second and third beam splitters and opposing the third pentaprism.

17. The optical apparatus of claim 16, wherein the first pentaprism comprises a first apex and the second pentaprism comprises a second apex and the first and second pentaprisms are arranged such that the first apex and the second apex are unaligned.

18. The optical apparatus of claim 16, wherein the first and second pentaprisms are shifted with respect to each other by a distance $S_1$ and the third and fourth pentaprisms are shifted with respect to each other by a distance $S_2$, and $S_1$ and $S_2$ are in operative relation to a pitch between the plurality of beamlets.

19. A system comprising:
   a light source to provide an incident light beam; and
   a beam splitter apparatus to split the incident light beam into a plurality of beamlets separated from each other by a pitch P, wherein the beam splitter apparatus comprises:
   a beam splitter, wherein the beam splitter splits the incident light beam S number of times;
   a first set of prisms disposed along a first axis, wherein each of the prisms of the first set of prisms contacts the beam splitter along dimension $L_z$ and an $n^{th}$ prism of the first set of prisms is a distance $Z_n$ from a first reference point, where $Z_n$ is calculated according to a first formula:

$$Z_n = \sum_{n=1}^{s-1} \frac{n \cdot L_z}{2};$$

and
   a second set of prisms disposed along a second axis that is orthogonal to the first axis, wherein each of the prisms of the second set of prisms contacts the beam splitter along dimension $L_x$ and an $n^{th}$ prism of the second set of prisms is a distance $X_n$ from a second reference point, where $X_n$ is calculated according to a second formula:

$$X_n = \sum_{n=1}^{s-1} \frac{n \cdot L_x}{2} + P \cdot 2^{(n-2)}.$$

20. The system of claim 19, wherein the beam splitter is a cube beam splitter, and the first reference point is a first side of the cube beam splitter and the second reference point is a second side of the cube beam splitter.

21. The system of claim 19, wherein the each prism of the first and second set of prisms is a corner cube prism.

* * * * *

UNITED STATES PATENT AND TRADEMARK OFFICE
CERTIFICATE OF CORRECTION

PATENT NO. : 7,551,359 B2　　　　　　　　　　　　　　　　　　　　　　Page 1 of 1
APPLICATION NO. : 11/531870
DATED : June 23, 2009
INVENTOR(S) : Andrew J. Murnan It is certified that error appears in the above-identified patent and that said Letters Patent is hereby corrected as shown below:

Title Page;

Page 2, Column 2, Other Publications,
Line 6, Delete ""Bean" and insert -- "Beam --, therefor.

Column 7,
Line 28-29, Delete "1 8A" and insert -- 18A --, therefor.

Column 17,
Line 36, Delete "relative" and insert -- relative dimensions of corner cube prisms 104, 106, 108, 110, 112, and 114 or the relative --, therefor.

Signed and Sealed this

Thirteenth Day of October, 2009

David J. Kappos
*Director of the United States Patent and Trademark Office*